United States Patent
Sugibayashi et al.

(10) Patent No.: US 7,692,956 B2
(45) Date of Patent: Apr. 6, 2010

(54) MAGNETIC RANDOM ACCESS MEMORY

(75) Inventors: Tadahiko Sugibayashi, Tokyo (JP);
Takeshi Honda, Tokyo (JP); Noboru Sakimura, Tokyo (JP)

(73) Assignee: NEC Corporation, Tokyo (JP)

( * ) Notice: Subject to any disclaimer, the term of this patent is extended or adjusted under 35 U.S.C. 154(b) by 184 days.

(21) Appl. No.: 12/089,090

(22) PCT Filed: Sep. 29, 2006

(86) PCT No.: PCT/JP2006/319430

§ 371 (c)(1),
(2), (4) Date: Apr. 3, 2008

(87) PCT Pub. No.: WO2007/040167

PCT Pub. Date: Apr. 12, 2007

(65) Prior Publication Data

US 2009/0122597 A1 May 14, 2009

(30) Foreign Application Priority Data

Oct. 3, 2005 (JP) ............... 2005-290425

(51) Int. Cl.
*G11C 11/00* (2006.01)
(52) U.S. Cl. ............... 365/158; 365/171; 365/210.1
(58) Field of Classification Search ............... 365/158, 365/171, 173, 55, 66, 189.07, 233.5, 210.1
See application file for complete search history.

(56) References Cited

U.S. PATENT DOCUMENTS

| 6,545,906 B1 | 4/2003 | Savtchenko et al. |
| 6,657,889 B1 * | 12/2003 | Subramanian et al. ...... 365/158 |
| 6,683,815 B1 * | 1/2004 | Chen et al. ............... 365/225.5 |
| 6,714,440 B2 * | 3/2004 | Subramanian et al. ...... 365/158 |
| 6,788,568 B2 * | 9/2004 | Hidaka ........................ 365/158 |
| 7,068,530 B2 * | 6/2006 | Hayashi ..................... 365/158 |
| 2002/0172073 A1 | 11/2002 | Hidaka |

FOREIGN PATENT DOCUMENTS

| JP | 2003-17665 | 1/2003 |
| JP | 2003-115578 | 4/2003 |
| JP | 2004-186658 | 7/2004 |
| JP | 2004-207322 | 7/2004 |
| JP | 2004-221288 | 8/2004 |
| JP | 2004-303382 | 10/2004 |
| JP | 2005-94002 | 4/2005 |
| JP | 2005-158985 | 6/2005 |

* cited by examiner

*Primary Examiner*—Gene N. Auduong
(74) *Attorney, Agent, or Firm*—Young & Thompson

(57) ABSTRACT

An MRAM is provided with a memory main body (2) having at least one cell array, and a magnetic field detecting section (4) which detects a magnetic field in the vicinity of the memory main body (2) and outputs the detection signal to the memory main body (2). In the cell array, a memory main body (2), which has a plurality of magnetic memory cells including a multilayer ferri-structure as a free layer, stops a prescribed operation of the memory main body (2), based on the detection signal.

18 Claims, 27 Drawing Sheets

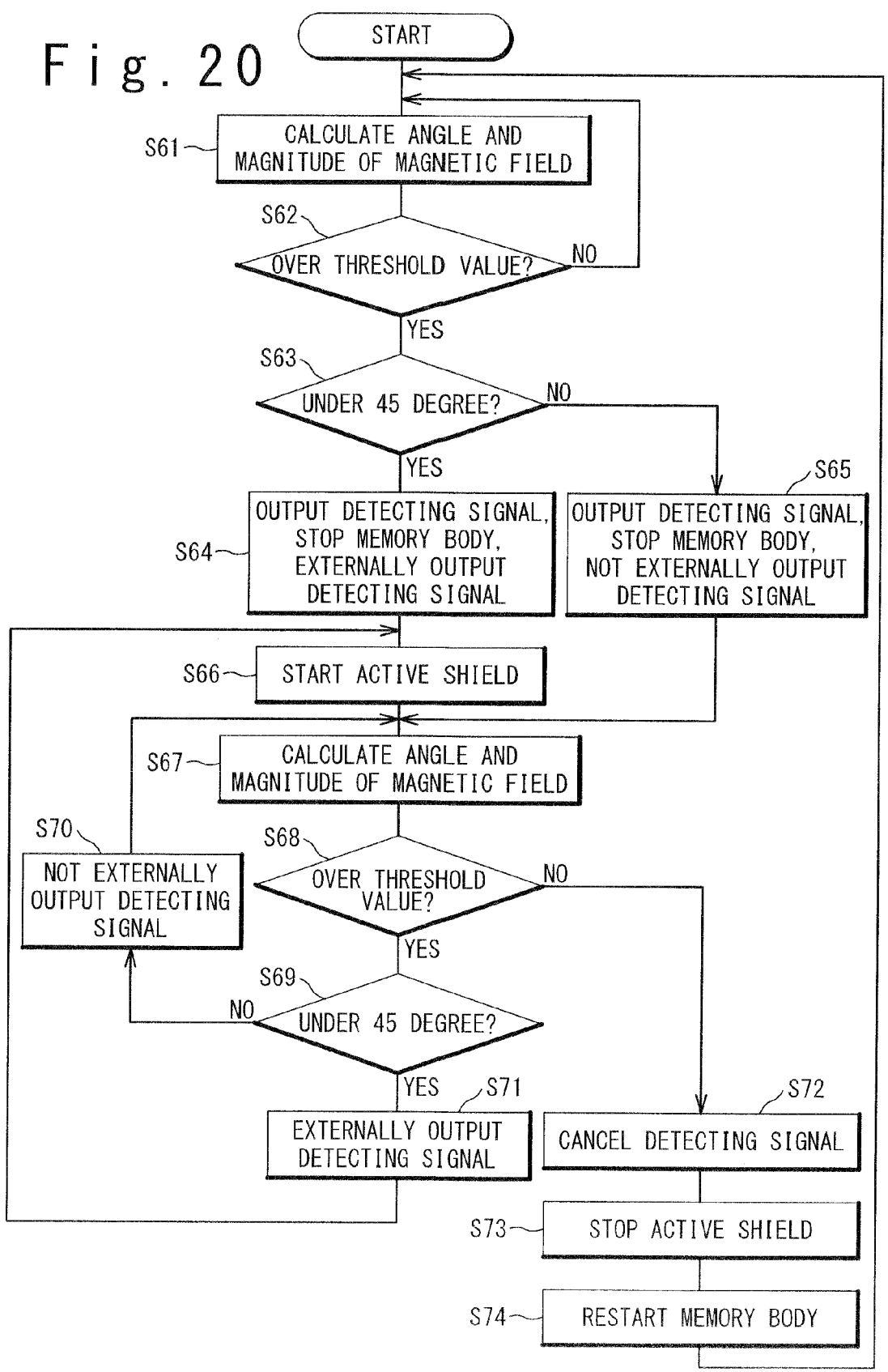

MAGNETIC RANDOM ACCESS MEMORY

TECHNICAL FIELD

The present invention relates to a magnetic random access memory and relates to a magnetic random access memory in which the influence of an external magnetic field is suppressed.

BACKGROUND ART

A conventional magnetoresistive random access memory (hereafter, referred to as "MRAM") in which a laminated ferri structure is used as the free layer of the tunnel magnetoresistive element (hereafter, referred to as "magnetoresistive element") is disclosed in U.S. Pat. No. 6,545,906. This kind of MRAM is a so-called toggle MRAM. FIG. 1 is a sectional view showing a configuration of the conventional magnetoresistive element 125. The magnetoresistive element 125 is arranged between a write word line 126 and a write bit line 127 and separated away from both of them. The magnetoresistive element 125 includes a free layer 111, a tunnel insulating layer 112, a pinned layer 113 and an anti-ferromagnetic layer 114. The free layer 111 and the pinned layer 113 are formed with the tunnel insulating layer 112 being pinched between them. The pinned layer 113 is a laminated ferri structure in which a non-magnetic layer 117 is sandwiched between a ferromagnetic layer 116 and a ferromagnetic layer 118. The direction of the magnetization of the pinned layer 113 is fixed by the anti-ferromagnetic layer 114. The free layer 111 is also a laminated ferri structure in which a non-magnetic layer 120 is sandwiched between a ferromagnetic layer 119 and a ferromagnetic layer 121. Due to the laminated ferri structure, the magnetic field is not generated out of the pinned layer 113 and the free layer 111, unless an external magnetic field is applied.

FIG. 2 is a top view showing the configuration of the conventional magnetoresistive element 125. A plurality of write word lines 126 and a plurality of write bit lines 127 are arranged orthogonally to each other. However, only one write word line 126 and one write bit line 127 are shown in the drawing. The magnetoresistive element 125 is arranged at each of the intersections of the plurality of write word lines 126 and the plurality of write bit lines 127. The magnetoresistive element 125 is oriented to the direction in which an easily-magnetized direction (a magnetization easy axis: indicated by a broken line arrow mark in the magnetoresistive element 125) is inclined at 45 degrees with respect to both of the write word line 126 and the write bit line 127.

This MRAM is the toggle MRAM. In a case of a memory cell 120 in this toggle MRAM, writing is executed only in the manner [1]→[0] or [0]→[1]. [1] cannot be overwritten to [1], and [0] cannot be overwritten to [0]. In the overwriting operation, at first, a reading operation is performed on the memory cell 120 on which the writing is tried to be performed (hereafter, also referred to as "selected cell").

Next, when the writing is executed, a write current IWBL is supplied to the write bit line 127. Next, after a time interval, a write current IWWL is supplied to the word line 126.

FIG. 3A to FIG. 3C are graphs showing the trajectories of the writing magnetic field induced by the write current. FIG. 3A shows the case of the selected cell (the memory cell 120 selected by the selected write bit line 127 and the selected write word line 126). FIG. 3B shows the case of the non-selected cell (the memory cell 120 connected to either one of the selected write bit line 127 and the selected write word line 126). As shown in FIG. 3A, when this trajectory goes round a flop magnetic field Hf, the magnetization of the free layer 111 is changed, such as [1]→[0] or [0]→[1]. On the other hand, as shown in FIG. 3B, when this trajectory does not go round the flop magnetic field Hf, the magnetization of the free layer 111 is not changed.

A magnetization inversion mode, which is referred to as the direct mode, exists in the neighborhood of the flop magnetic field, as described in U.S. Pat. No. 6,545,906, which can be used for the MRAM. In this direct mode, it is a merit that a method of the magnetization of a magnetic body can be determined in accordance with the data to be written on the memory cell 120. That is, when [1] is to be written, the process for writing [1] is carried out, irrespectively of the storage state of the memory cell 120 immediately before. FIG. 3C shows a case of a selected cell in the direct mode. As shown in FIG. 3C, when this trajectory exceeds the flop magnetic field Hf, the magnetization of the free layer 111 becomes, for example, [1] or [0]→[1]. However, when a giant magnetic field is applied, the magnetization of the laminated ferri structure is saturated, and the magnetizations of the two ferromagnetic bodies 116, 118 in the free layer 111 become approximately same direction as shown in FIG. 4. That is, the direction of the magnetization of the ferromagnetic layer 116 and the direction of the magnetization of the ferromagnetic layer 118 become unstable, which brings about disturbances in data.

On the other hand, there is a case that a magnet exists around a system (exemplified by the personal computer) using the MRAM. For example, a magnet is used in the speaker and the like. The possibility that a magnet stays near the MRAM cannot be perfectly removed. When an external magnetic field is applied to the MRAM, the following problems occur. For example, when an external magnetic field is applied during the writing operation, the possibility of erroneous writing becomes high. FIGS. 5A to 5C are graphs showing the trajectory of the writing magnetic field induced by the write current when an external magnetic field is applied. FIG. 5A shows the case of the selected cell, FIG. 5B shows the case of the non-selected cell, and FIG. 5C shows the holding cell (a memory cell 120 that is not connected to any of the selected write bit line 127 and the selected write word line 126), respectively.

With reference to FIG. 5A, there is a possibility that the trajectory of the magnetic field of a selected cell does not pass outside the flop magnetic field Hf, because the trajectory is shifted by an external magnetic field HD. That is, there is a risk of the failure in the writing. With reference to FIG. 5B, there is a possibility that the trajectory of the magnetic field of the non-selected cell is shifted by the external magnetic field HD and approaches the neighborhood of the flop magnetic field Hf. That is, there is a risk that the writing (magnetization inversion) through the direct mode occurs in the non-selected cell. With reference to FIG. 5C, when the external magnetic field HD near the flop magnetic field Hf is applied to a holding cell, there is a risk of the occurrence of the writing (magnetization inversion) through the direct mode. That is, the application of an external magnetic field brings about the problem of the drop in the reliability, such as the case that the writing is not performed correctly or stored data is broken. Thus, a technique for protecting data of the MRAM from external magnetic fields and avoiding the erroneous operations is desired.

As a method for protecting data from an external magnetic field, a technique in which a soft-magnetic body is arranged around the MRAM or a system using the MRAM so that a magnetic flux flows through the shielding plate of the soft-magnetic body is known. For example, in Japanese Laid Open Patent Application JP-P2004-207322A, a magnetic memory device is disclosed. This magnetic memory device is a magnetic random access memory composed of memory elements, each of which is laminated with: a magnetization pinned layer whose magnetization direction is fixed; and a magnetic layer whose magnetization direction is changeable are laminated.

The plurality of memory elements, or the memory element and the other element are laminated, and a magnetic shielding layer is formed at least on an area occupied by the memory elements for magnetically shielding the memory elements. FIG. 6 is a sectional view showing the MRAM (Magnetic Memory Device) to which this conventional data protecting method is applied. That is, the MRAM contains: a package 131, which includes therein a filler 132, an MRAM chip 134, a bonding wire 135 and a lead frame 136; and shielding plates (magnetic shielding layers) 133 made of soft magnetic materials formed over and under the package 131 with the MRAM chip 134 between.

As a related technique, in Japanese Laid Open Patent Application JP-P 2003-115578A, a nonvolatile solid magnetic memory device, a manufacturing method and a multi-chip package thereof are disclosed. This nonvolatile solid magnetic memory device has an MRAM chip and a package placed around the MRAM chip. The MRAM chip is composed of: magnetoresistive elements arranged in a matrix on a substrate; bit lines connected to the magnetoresistive elements; write lines to apply a magnetic field to the magnetoresistive elements; and field effect transistors, and has a plurality of memory elements. A magnetic shielding structure for shielding the MRAM chip from an external scattered magnetic field is formed.

In Japanese Laid Open Patent Application JP-P 2004-186658A, a magnetic detecting element and a manufacturing method thereof are disclosed. This magnetic detecting element has: a multi-layer film in which at least a first anti-ferromagnetic layer, a pinned magnetic layer, a non-magnetic material layer and a free magnetic layer are laminated on a substrate; and a magnetization control layer for controlling the magnetization of the free magnetic layer. The pinned magnetic layer has: a first magnetic layer extending in a track width direction and is located on the side in contact with the first anti-ferromagnetic layer; a second magnetic layer opposite to the first magnetic layer in the direction of the film; and a non-magnetic intermediate layer located between the first and second magnetic layer. The magnetization of the first magnetic layer and that of the second magnetic layer are anti-parallel to each other. The first anti-ferromagnetic layer is formed in contact with, from the film thickness direction, both side ends in the track width direction of the first magnetic layer, through a gap of a predetermined interval in the track width direction. The characteristic is that the electric resistances are changed based on the magnetization direction of the free magnetic layer in the gap and the magnetization direction inside the second magnetic layer.

In Japanese Laid Open Patent Application JP-P 2004-221288A, a magnetic memory device is disclosed. This magnetic memory device is a magnetic random access memory constituted by memory elements, each of which is composed of: a magnetization pinned layer whose magnetization direction is fixed; and a magnetic layer whose magnetization direction is changeable are laminated. A magnetic shielding layer for magnetically shielding the memory elements is formed. This magnetic memory device is characterized in that the memory elements are located while avoiding the periphery and center of the magnetic shielding layer.

In Japanese Laid Open Patent Application JP-P 2005-94002A, a magnetic memory cell, a magnetic memory array and a manufacturing method thereof are disclosed. This magnetic memory cell contains a basic body, a magnetic tunnel junction element, a first insulating layer, a magnetic shielding layer and a second insulating layer. The magnetic tunnel junction element is formed in a partial region on the basic body. The first insulating layer is formed to cover the regions except the partial region on the basic body and cover the all edge surface of the magnetic tunnel junction element.

The magnetic shielding layer is formed to surround at least a part of the periphery of the magnetic tunnel junction element through the first insulating layer and is electrically insulated from the basic body and the magnetic tunnel junction element. The second insulating layer is formed to cover the portions except the magnetic tunnel junction element. This is characterized in that the magnetic tunnel junction element and the magnetism shielding layer are magneto-statically coupled to each other.

In Japanese Laid Open Patent Application JP-P2005-158985A, a mounting structure and a mounting substrate of a magnetic memory device are disclosed. In the mounting structure of this magnetic layer device, the magnetism shielding layer for magnetically shielding the magnetic random access memory constituted by a memory element, in which the magnetization pinned layer whose magnetization direction is fixed and the magnetic layer whose magnetization direction is changeable are laminated, is formed on a printed wiring board for mounting and/or an interposer substrate.

DISCLOSURE OF INVENTION

An object of the present invention is to provide an MRAM that can prevent a stored data from being damaged by an external magnetic field to protect the data.

Another object of the present invention is to provide an MRAM that can prevent the MRAM from being operated erroneously against an external magnetic field.

Still another object of the present invention is to provide an MRAM that can prevent the reliability of the MRAM from dropping against an external magnetic field.

Those objects of the present invention and the objects and benefits other than them can be easily verified from the following descriptions and the attached drawings.

In order to solve the above-mentioned subjects, the magnetic random access memory of the present invention contains: a memory body including at least one cell array; and a magnetic field detecting section configured to detect an external magnetic field in a circumference area of the memory body to output a detecting signal to the memory body. The cell array contains a plurality of magnetic memory cells. Each of the plurality of magnetic memory cells includes a magnetoresistive element containing a laminated ferri structure as a free layer.

In the present invention, the existence of the external magnetic field is reported to the memory body by the detecting signal. Thus, the memory body can execute various controls, correspondingly to the detecting signal. Hence, it is possible to carry out suitable operations such as an erroneous operation prevention, the data protection and the like.

In the foregoing magnetic random access memory, the memory body is configured to stop a predetermined operation of the memory body in response to the detecting signal.

In the present invention, under the existence of the external magnetic field, predetermined operations (exemplifications: a writing operation and reading operation) that are liable to receive the influence of the external magnetic field are stopped, so that the erroneous operation can be prevented. Consequently, the operational reliability can be improved.

The foregoing magnetic random access memory further contains an output section configured to receive the detecting signal outputted from the magnetic field detecting section to output the detecting signal to outside.

In the present invention, the existence of the external magnetic field can be reported to the outside. Thus, the inhibition of an access to the memory, a warning to a user and the like can be used to prevent erroneous operations of the system in which the MRAM is installed and avoid the cause of the error.

The foregoing magnetic random access memory further contains a reference cell writing section configured to executing a writing on a reference cell of the plurality of magnetic memory cells. The memory body restarts the writing in response to a cancellation of the detecting signal after the predetermined operation being a writing operation. The reference cell writing section is configured to execute a writing on the reference cell before a start of the writing operation.

In the present invention, when the writing operation restarts, the writing is again performed on the reference cell. Thus, even if the reference cell is destructed by the external magnetic field, the restart can be suitably executed.

In the foregoing magnetic random access memory, the magnetic field detecting section is configured to output a direction signal indicating a direction of the external magnetic field. The magnetic random access memory further contains a magnetic field generating section configured to generate a shield magnetic field whose direction is corresponding to the direction of the external magnetic field on the memory body based on the detecting signal and the direction signal.

In the present invention, the shielding magnetic field corresponding to the external magnetic field is generated, which can suppress the influence of the external magnetic field and can prevent the erroneous operation caused by the external magnetic field and the data from being destructed.

In the foregoing magnetic random access memory, the plurality of magnetic memory cells are toggle cells. The magnetic field generating section includes a coiled interconnection winded to direct a magnetization hard axis of each of the plurality of magnetic memory cells to surround the memory body.

In the present invention, the coiled wiring is used to generate the shielding magnetic field. Thus, the magnetic field generator can be easily formed.

In the foregoing magnetic random access memory, the magnetic field detecting section includes: a plurality of magnetoresistive elements whose directions of magnetization easy axes are different to each other; and a calculating section configured to calculate a direction and a magnitude based on a resistance of each of the plurality of magnetoresistive elements.

In the present invention, the magnitude and direction of the external magnetic field are detected by using the magnetoresistive elements similar to the magnetic memory cells. Thus, the manufacturing is easy.

In order to solve the above-mentioned subjects, A magnetic random access memory contains: a plurality of cell arrays; a plurality of peripheral circuits formed between the plurality of cell arrays; and a shield magnetic body formed over the plurality of peripheral circuits and designed to shield an external magnetic field in a circumference of the plurality of cell arrays. Each of the plurality of cell arrays includes a plurality of magnetic memory cells.

In the present invention, the shield magnetic bodies (60, 61) against the external magnetic field are arranged over a peripheral circuits arranged between the cell arrays. Thus, the external magnetic field can be shielded without any increase in the area and the number of the processing steps.

In the foregoing magnetic random access memory, each of the plurality of magnetic memory cells contains a magnetoresistive element including a first laminated ferri structure as a free structure. The shield magnetic body includes a plurality of first magnetic memory cells. Each of the plurality of first magnetic memory cells contains a magnetoresistive element which includes a second ferri structure as a free layer. A magnetization easy axis of the first laminated ferri structure and a magnetization easy axis of the second laminated ferri structure are substantially orthogonal to each other.

In the present invention, the shield magnetic body against the external magnetic field is the second laminated ferri structure having the magnetic anisotropy that is substantially orthogonal to the first laminated ferri structure of the magnetic memory cell. Thus, it is possible to efficiently shield the toggle cell (the magnetic memory cell).

In the foregoing magnetic random access memory, the shield magnetic body includes a plurality of second magnetic memory cells of the plurality of magnetic memory cells. Each of the plurality of second magnetic memory cells contains a magnetoresistive element including a third laminated ferri structure as a free layer. A magnetization easy axis of the first laminated ferri structure and a magnetization easy axis of the third laminated ferri structure are substantially orthogonal to each other.

In the present invention, the shield magnetic body is also placed over the magnetic memory cell. Thus, the shielding can be executed more efficiently.

In the foregoing magnetic random access memory, a laminated structure of the shield magnetic body is same to a laminated structure of each of the plurality of magnetoresistive elements.

In the present invention, the shield magnetic body is formed at a same process with the cell magnetic body in the magnetic memory cell. Thus, the shield magnetic body can be cheaply configured.

In order to solve the above-mentioned subjects, an operating method of a magnetic random access memory contains: (a) detecting an external magnetic field whose magnitude is larger than a reference value in a circumference area of a memory body including at least one cell array to output a detecting signal to the memory body; and (b) stopping a writing operation of the memory body in response to the detecting signal. The cell array contains a plurality of magnetic memory cells. Each of the plurality of magnetic memory cells includes a magnetoresistive element containing a laminated ferri structure as a free layer.

In the foregoing operating method of the magnetic random access memory, the (b) stopping includes: (b1) outputting the detecting signal to outside.

The foregoing operating method of the magnetic random access memory further contains: (c) canceling the detecting signal when a magnitude of the external magnetic field is detected to be smaller than a reference value in a circumference area of the memory body; and (d) restarting the writing operation on the memory body in response to the cancellation of the detecting signal.

In the foregoing operating method of the magnetic random access memory, the (d) restarting includes: (d1) executing writing on a reference cell of the plurality of the magnetic memory cells before the restarting.

In the foregoing operating method of the magnetic random access memory, the (a) detecting includes: (a1) outputting a direction signal indicating a direction of the external magnetic field. The operating method further contains: (e) generating a shield magnetic field having a direction corresponding to the direction on the memory body based on the detecting signal and the direction signal.

In the foregoing operating method of the magnetic random access memory, the plurality of memory cells are toggle cells. The (e) generating includes: (e1) generating the shield magnetic field so that a synthesized magnetic field of the external magnetic field and the shield magnetic field is kept away from a flop magnetic field of each of the plurality of memory cells in a magnetization hard axis of each of the plurality of magnetic memory cells.

In the foregoing operating method of the magnetic random access memory, the (a1) outputting includes: (a11) calculating a direction and a magnitude of the external magnetic field based on a resistance of each of the plurality of magnetoresistive elements formed in a circumference area of the memory body and whose magnetization easy axis direction is different to each other.

According to the present invention, it is possible to protect data stored in the MRAM from an external magnetic field and suppress erroneous operations.

BRIEF DESCRIPTION OF THE DRAWINGS

FIG. 20 is a flowchart showing another operation of the second embodiment of the MRAM of the present invention;

BEST MODE FOR CARRYING OUT THE INVENTION

Embodiments of the MRAM of the present invention will be described below with reference to the accompanying drawings.

First Embodiment

Figure 7A:
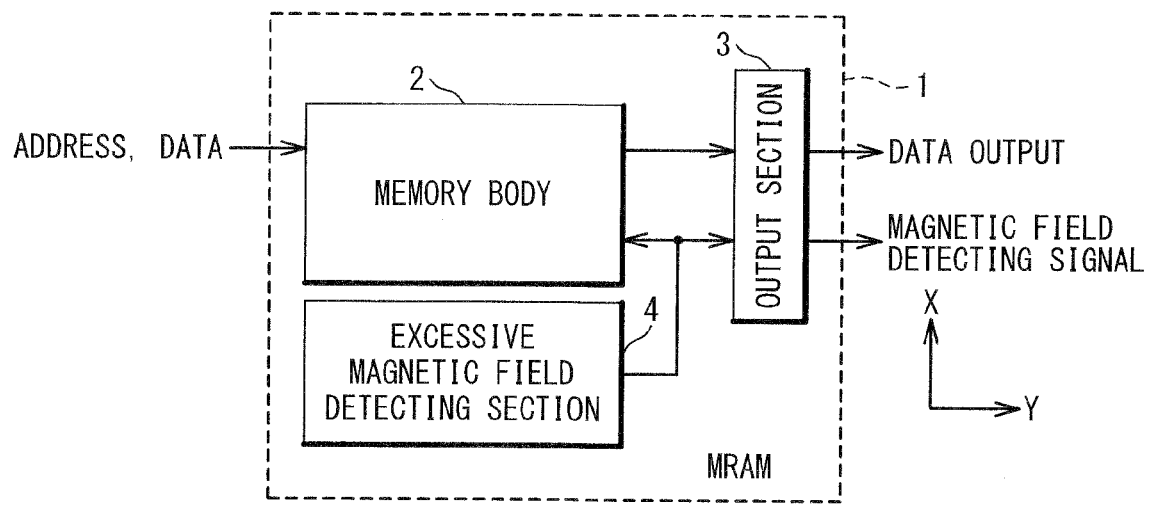
FIG. 7A is a block diagram showing the configuration of first, third and fifth embodiments of the MRAM of the present invention.

The configuration of the first embodiment of the MRAM of the present invention will be described below. FIG. 7A is a block diagram showing the configuration of the first embodiment of the MRAM of the present invention. An MRAM 1 contains a memory body 2, an excessive magnetic field detecting section 4 and an output section 3. Here, the X-Y coordinates indicate the coordinates in the MRAM 1.

Figure 5A:
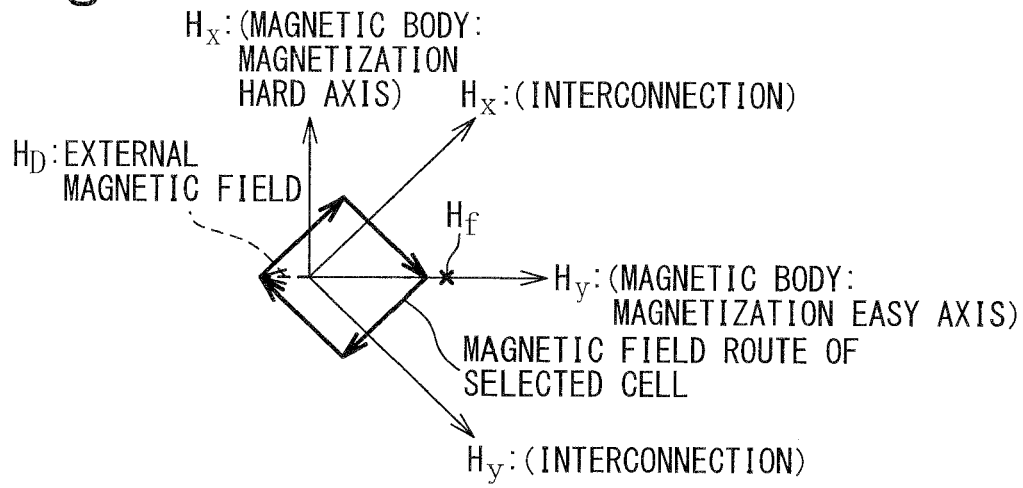
FIG. 5A is the graph showing the trajectory of the writing magnetic field induced by a write current when an external magnetic field is applied.
Figure 5B:
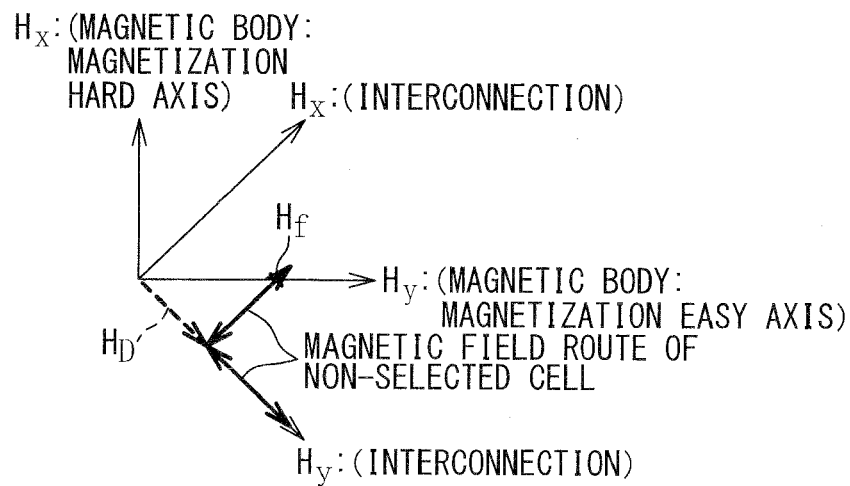
FIG. 5B is the graph showing the trajectory of the writing magnetic field induced by a write current when an external magnetic field is applied.
Figure 5C:
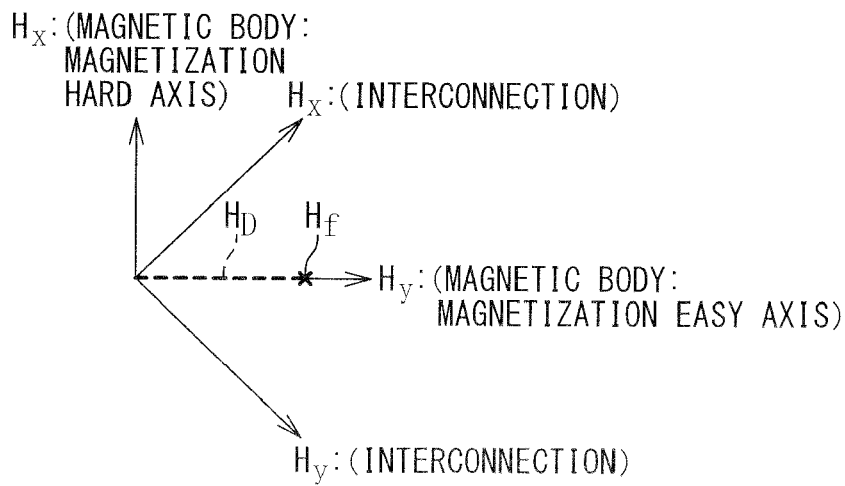
FIG. 5C is the graph showing the trajectory of the writing magnetic field induced by a write current when an external magnetic field is applied.

The memory body 2 contains at least one cell array 23. The cell array 23 contains: a plurality of write word lines (52: which will be described later) extending in an X-direction; a plurality of write bit lines (51: which will be described later) extending in a Y-direction; and a plurality of magnetic memory cells (20: which will be described later). The magnetic memory cell includes a magnetoresistive element, which includes a free layer, a tunnel insulating layer, a pinned layer and an anti-ferromagnetic layer. The free layer and the pinned layer are the laminated ferri structure bodies. The operation of the memory body 2 is stopped in response to a magnetic field detecting signal (which will be described later) outputted by the excessive magnetic field detecting section 4. The operation includes the writing operation to a plurality of magnetic memory cells 20. As shown in FIGS. 5A to 5C, the operation receives bad influences caused by the magnetic field. Due to the stop of the operation, the erroneous operation of the MRAM 1 can be prevented.

As for the stop of the operation of the memory body 2, if it is in the state of the preparation for writing data to the magnetic memory cell at the moment when the magnetic field detecting signal is detected (exemplification: the state of inputting address signal in a decoder or a selector), following outputs of signals is stopped, and the real writing of data is halted. However, if it is in the state that data is just being written to the memory cell, when the halting is executed, the operation is occurred surely erroneously. Thus, the writing operation is executed to its end.

The excessive magnetic field detecting section 4 detects the existence of the magnetic field of the circumference area of the memory body 2 and its magnitude to output the magnetic field detecting signal to the memory body 2 and the output section 3. The magnetic field detecting signal is the signal indicating that the magnetic field having a predetermined magnitude or more is detected. The magnetic field having the predetermined magnitude influences on the operation and the data holding of the MRAM 1. The magnitude is predetermined in accordance with an experiment or simulation. The magnetic field detecting signal may indicate the magnitude of the detected magnetic field. In this case, the memory body 2 can execute the control in detail correspondingly to the magnitude value and can improve the reliability when the magnetic field is applied.

The output section 3 outputs the output signal from the memory body 2 to the outside. In response to the magnetic field detecting signal outputted by the excessive magnetic field detecting section 4, the operation of the output section 3 is stopped, and the magnetic field detecting signal is outputted to the outside. As the outside, when the MRAM 1 is mounted in a computer, a CPU of the computer is exemplified. The CPU stops the operation of using the MRAM 1 in response to the interruption of the magnetic field detecting signal. Consequently, the erroneous operation can be prevented. By displaying a warning of the magnetic field detection on a screen, an alert can be issued to a user.

Figure 7B:
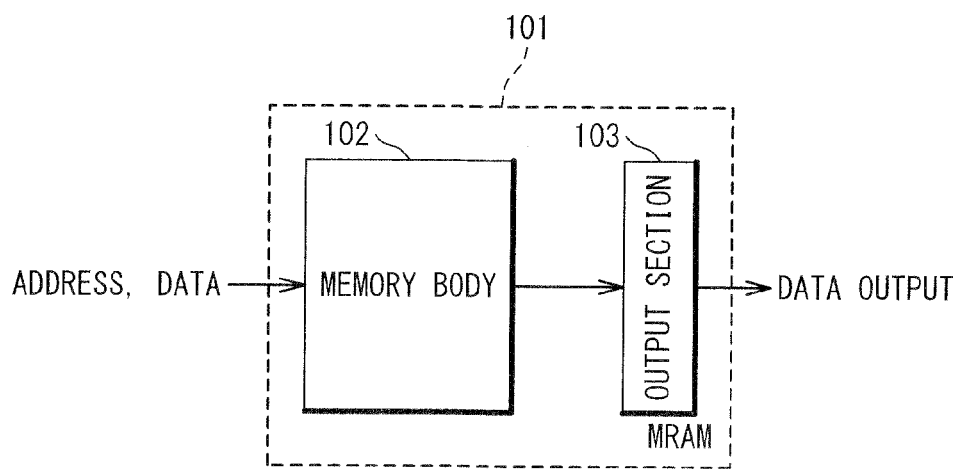
FIG. 7B is a block diagram showing the configuration of a conventional MRAM.
Figure 8A:
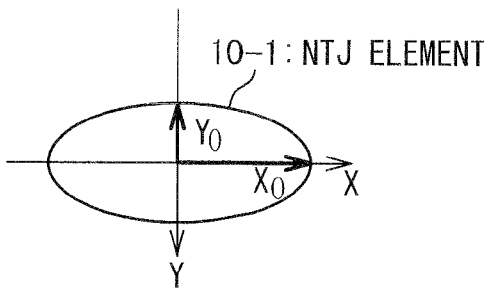
FIG. 8A is a conceptual view showing the configuration of an MTJ element in the excessive magnetic field detecting section in an embodiment of the MRAM of the present invention.
Figure 8B:
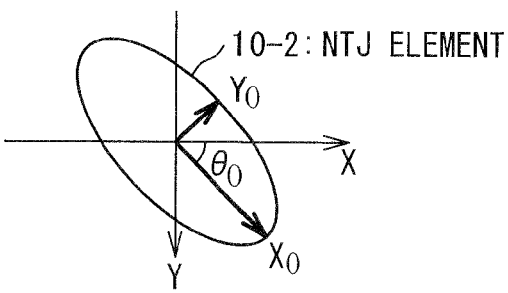
FIG. 8B is a conceptual view showing the configuration of an MTJ element in the excessive magnetic field detecting section in an embodiment of the MRAM of the present invention.
Figure 8C:
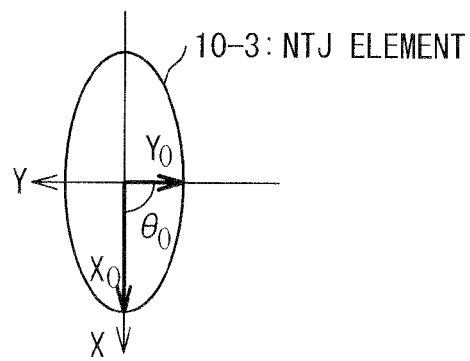
FIG. 8C is a conceptual view showing the configuration of an MTJ element in the excessive magnetic field detecting section in an embodiment of the MRAM of the present invention.
Figure 8D:
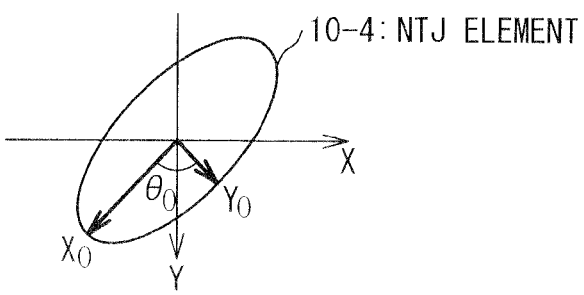
FIG. 8D is a conceptual view showing the configuration of an MTJ element in the excessive magnetic field detecting section in an embodiment of the MRAM of the present invention.

As shown in FIGS. 5A to 5C, when an external magnetic field is applied to the MRAM, there is a case that the data cannot be correctly written to the magnetic memory cell, or there is a case that the data held in the magnetic memory cell is destructed. Considering the phenomena shown in FIG. 5A to FIG. 5C, at first, the case when the data holding cell is inverted as the erroneous operation (when the erroneous writing occurs) is the case that, in the direction of the flop magnetic field Hf, the magnetic field equal to or greater than the Hf is applied (FIG. 5C). In that case, the magnitude of the magnetic field (the flop magnetic field Hf or more) and the direction (the magnetization easy axis direction) are limited. Thus, the possibility that the erroneous writing occurs is very lower than the cases in FIG. 5A and FIG. 5B. For this reason, in this embodiment, as shown in FIG. 7A, the excessive magnetic field detecting section 4 is installed inside the chip of the MRAM 1. Then, when the external magnetic field has a predetermined magnitude or more, the operation of the memory body 2 and the operation of the output section 3 are immediately stopped, and the fact that they are stopped in accordance with the magnetic field detecting signal is reported to the outside. In the MRAM of the present invention, the erroneous operation caused by the external magnetic field can be considerably reduced. On the other hand, as a reference, FIG. 7B shows a conventional MRAM 101. The conventional MRAM 101 does not have the excessive magnetic field detecting section 4. Thus, even while the external magnetic field is applied, the operation of the memory body 102 is continued, which brings about erroneous operations.

The excessive magnetic field detecting section 4 may be installed inside the chip of the MRAM, or may be installed outside the MRAM as a different chip and inside the same package, or may be installed outside the package of the MRAM. In any cases, the similar effect can be obtained. In the case of the installation outside the chip of the MRAM, there is the merit that the flexibility is improved from the viewpoint of the system.

Next, the method of realizing the excessive magnetic field detecting section 4 inside the chip of the MRAM 1 is explained. FIGS. 8A to 8D are conceptual views showing the configuration of the MTJ (Magnetic Tunneling Junction) element of the excessive magnetic field detecting section in an embodiment of the MRAM of the present invention. An MTJ element 10 is a magnetic sensor for detecting magnetic fields and has the lamination structure similar to the magnetoresistive element in the magnetic memory cell and has the similar shape. The MTJ elements 10-1 to 10-4 are arranged such that as shown in FIGS. 8A to 8D, the directions of the magnetization easy axis X0—the magnetization hard axis Y0 are oriented at various angles for the X-Y coordinates. That is, as for the MTJ element 10-1, the angle $\theta 0$ between the magnetization easy axis X0 and the X-axis is 0 degree. As for the MTJ element 10-2, the angle $\theta 0$ is 45 degree. As for the MTJ element 10-3, the angle $\theta 0$ is 90 degree. As for the MTJ element 10-4, the angle $\theta 0$ is 135 degree. In those MTJ elements 10, in such a way that even in the magnetic field envisioned to be applied, the orientation of the magnetization of the free layer is not inverted, the flop magnetic field Hf is set to be greater than the MTJ (the magnetoresistive element) in the magnetic memory cell.

Figure 9:
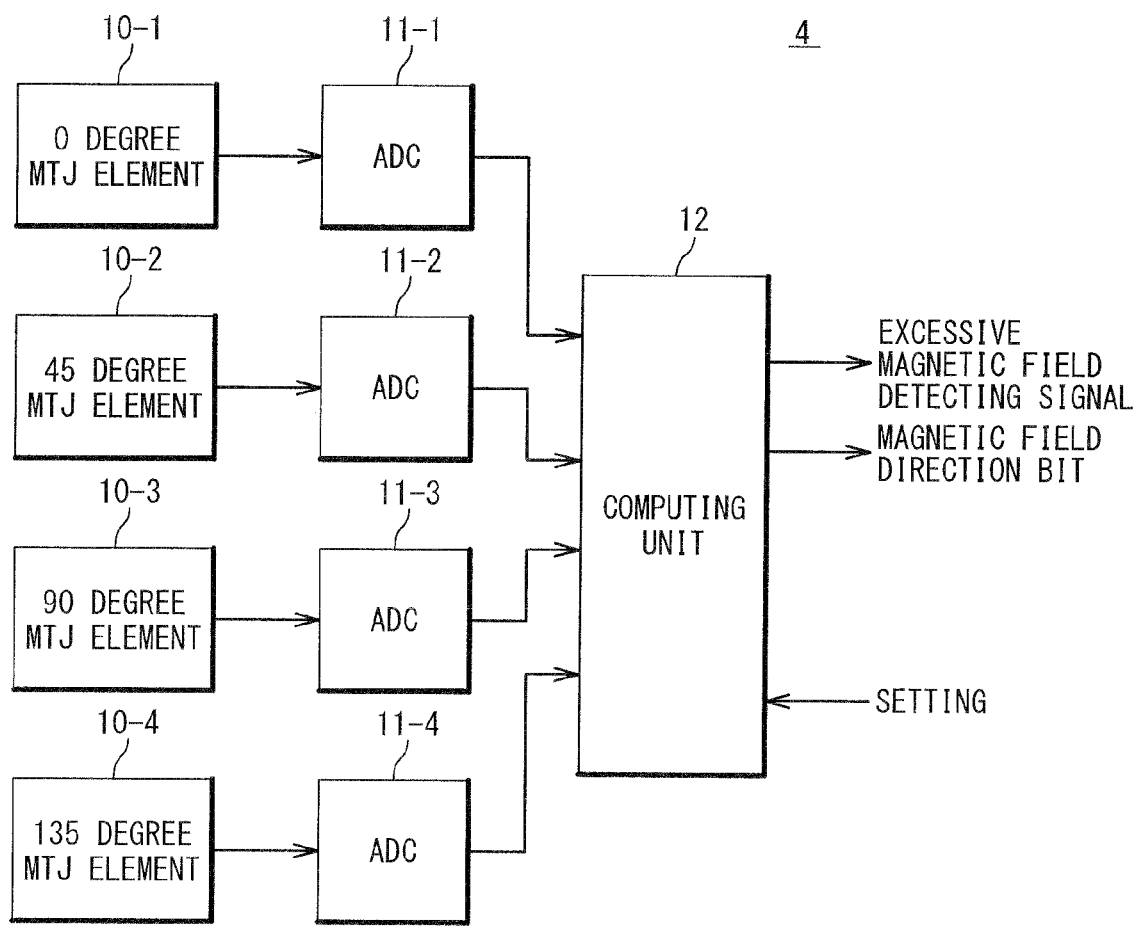
FIG. 9 is a block diagram showing the configuration of the excessive magnetic field detecting section in an embodiment of the MRAM of the present invention.

FIG. 9 is a block diagram showing the configuration of the excessive magnetic field detecting section in an embodiment of the MRAM of the present invention. The excessive magnetic field detecting section 4 contains the MTJ elements 10-1 to 10-4, ADCs (analog—digital converters) 11-1 to 11-4 and a calculator 12.

The MTJ elements 10-1 to 10-4 are oriented towards the directions shown in FIG. 8, respectively, and formed of the circumference area of the memory body 2. Each of the MTJ elements 10-1 to 10-4 outputs its resistance value (or the voltage value when a constant current is applied) to the corresponding ADC 11 among the ADCs 11-1 to 11-4. Each of the ADCs 11-1 to 11-4 receives the resistance value (or the voltage value when the constant current is applied) from the corresponding MTJ among the MTJ 10-1 to 10-4. Then, each of the resistance values is converted into a digital value and outputted to the calculator 12. The calculator 12 performs a predetermined calculation based on the digital values from the ADCs 11-1 to 11-4 to determine the magnitude and angle (orientation) of the external magnetic field.

Figure 10A:
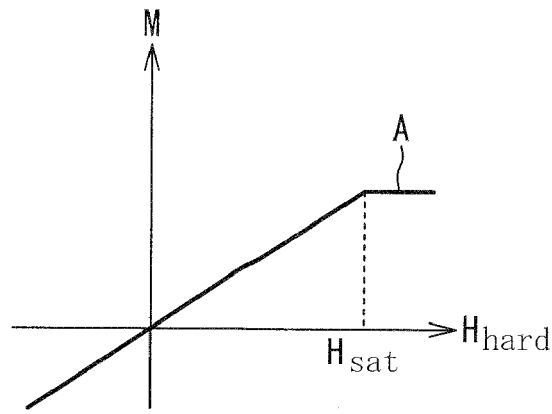
FIG. 10A is a graph showing a concept of the calculation of the excessive magnetic field detecting section in an embodiment of the MRAM of the present invention.
Figure 10B:
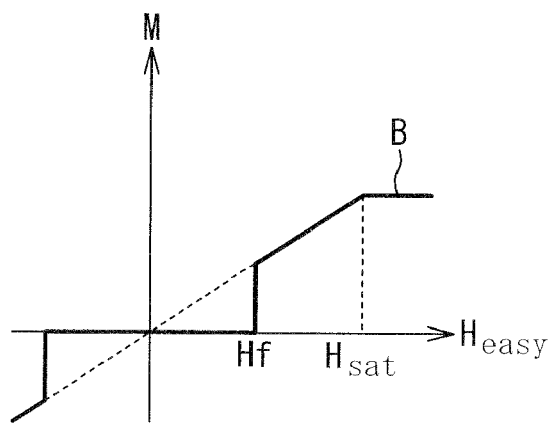
FIG. 10B is a graph showing a concept of the calculation of the excessive magnetic field detecting section in an embodiment of the MRAM of the present invention.
Figure 10C:
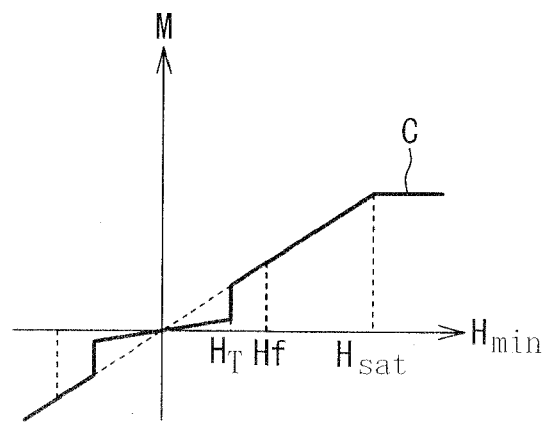
FIG. 10C is a graph showing a concept of the calculation of the excessive magnetic field detecting section in an embodiment of the MRAM of the present invention.

FIG. 10A to FIG. 10C are graphs showing the concept of the calculation of the excessive magnetic field detecting section in an embodiment of the MRAM of the present invention. FIG. 10A is a graph showing the relation between the magnetization M and the external magnetic field Hhard in the magnetization hard axis of the MTJ element 10. FIG. 10B is a graph showing the relation between the magnetization M and the external magnetic field Heasy in the magnetization easy axis of the MTJ element 10. FIG. 10C is a graph showing the relation between the magnetization M and the external magnetic field Hmin in the direction between the magnetization easy axis and the magnetization hard axis of the MTJ element 10. The longitudinal axis indicates the magnetization M, and the lateral axis indicates respective external magnetic field H to be applied.

As indicated by a curve A in FIG. 10A, when the applied external magnetic field Hhard is between 0 and Hs, the magnetization M is linearly varies for the external magnetic field. When the applied external magnetic field Hhard is Hs (the saturation magnetic field) or more, the magnetization M is saturated and becomes constant. As indicated by a curve B in FIG. 10B, when the applied external magnetic field Heasy is between 0 and Hf (the flop magnetic field), the inner antiferromagnetic coupling is not broken so that the magnetization is hard to be induced and the magnetization M becomes substantially 0. When the applied external magnetic field Heasy becomes Hf, the magnetization X is discontinuously increased. Between Hf and Hs after that, the magnetization M linearly varies for the external magnetic field. When the applied external magnetic field Heasy is Hs or more, the magnetization M is saturated and becomes constant. As indicated by a curve C in FIG. 10C, the magnetization shows an eclectic property of the properties shown in the curve A and the curve B. When the applied external magnetic field Hmid is smaller than Hf, the magnetization M is induced slightly and monotonically-increasingly for the external magnetic field Hmid. When it becomes a certain threshold HT (<Hf), the magnetization M is discontinuously increased. After that, it exceeds Hf, and until Hs, the magnetization M linearly varies for the external magnetic field. When the applied external magnetic field Hmid becomes Hs or more, the magnetization M is saturated and becomes constant.

In this way, each MTJ element 10 has the magnetization M, which corresponds to the orientation and magnitude of the external magnetic field felt by the MTJ element 10. The variation in the magnitude of this magnetization M corresponds to the variation in the magnitude of the resistance value of the MTJ element 10. Thus, the resistance values are obtained for the plurality of MTJ elements 10, respectively, whose directions of the magnetization easy axes are different to each other. By checking the obtained resistance values, it is possible to estimate the orientation and magnitude of the existing magnetic field.

Figure 1:
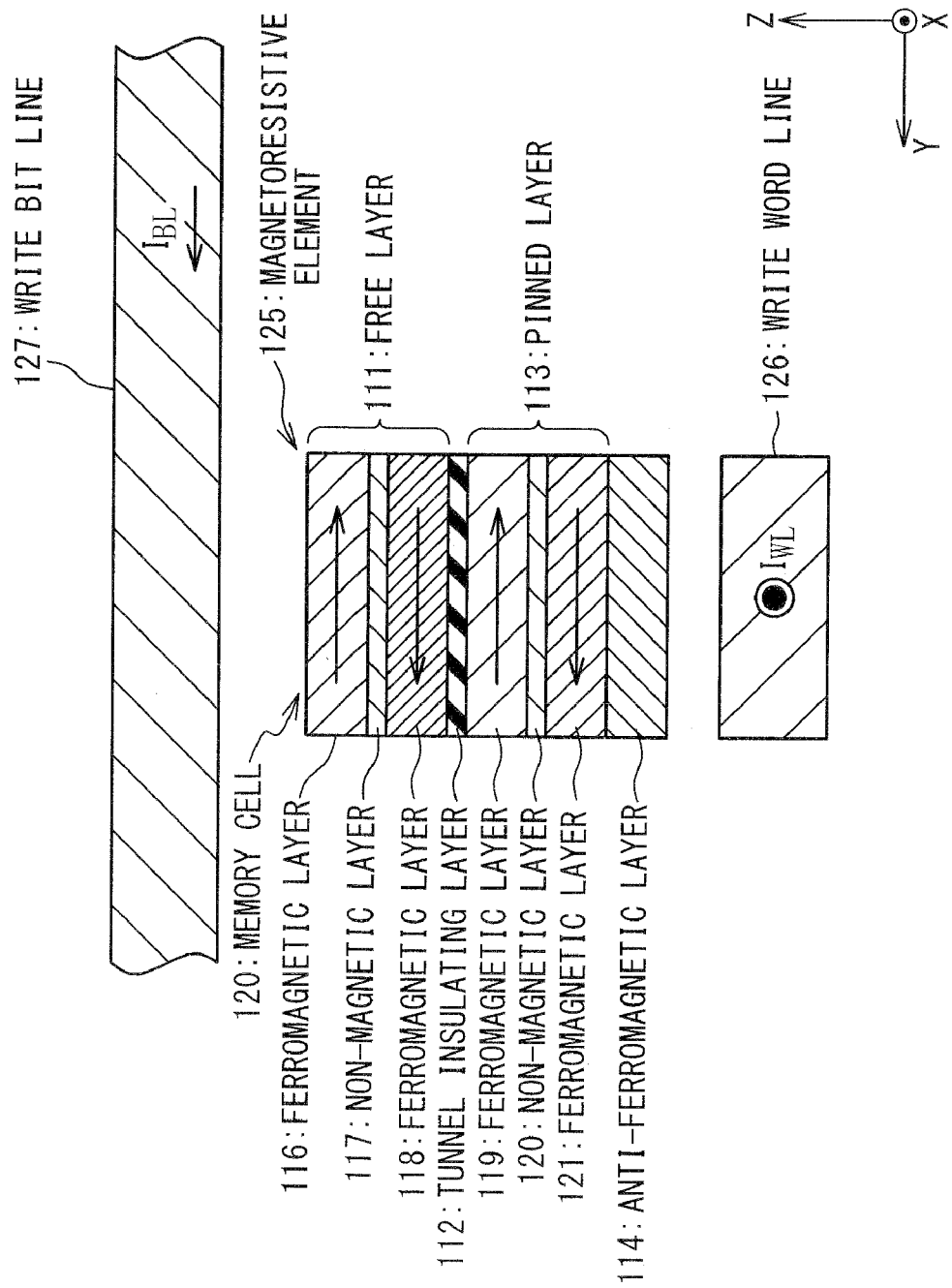
FIG. 1 is a sectional view showing the configuration of the conventional magnetoresistive element.
Figure 2:
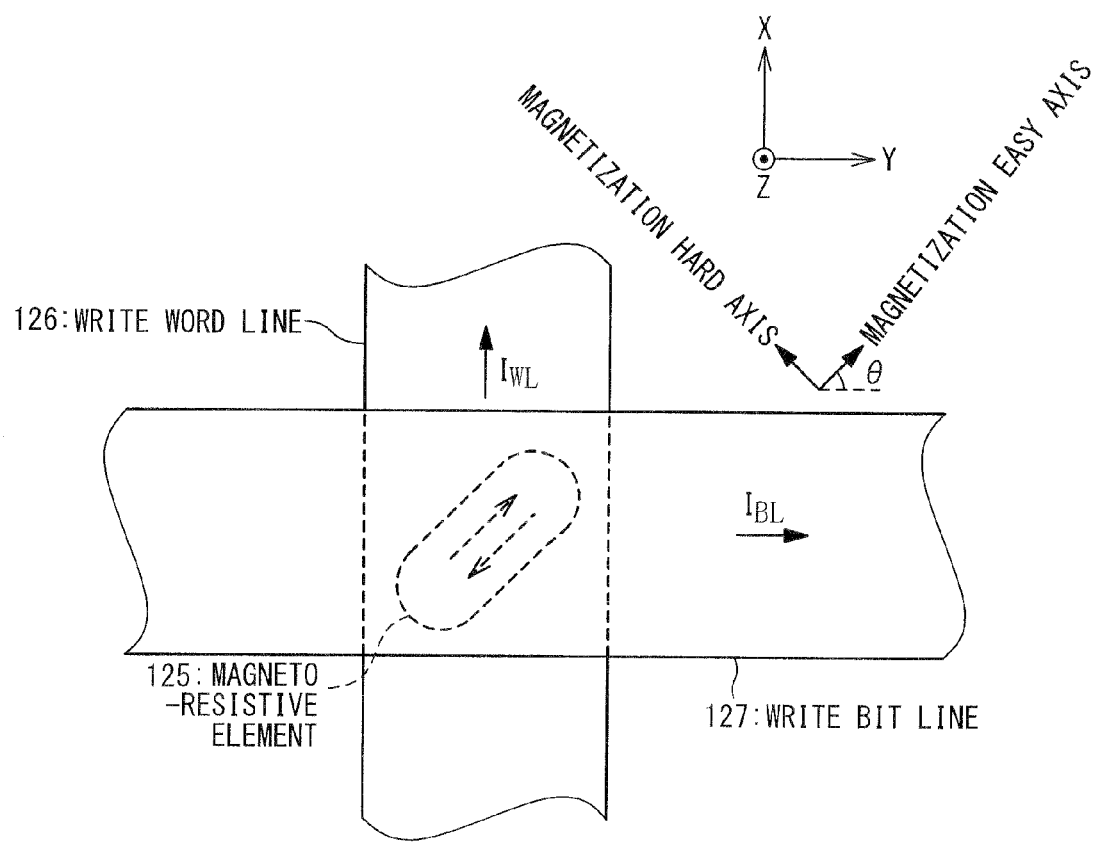
FIG. 2 is the top view showing the configuration of the conventional magnetoresistive element.
Figure 3A:
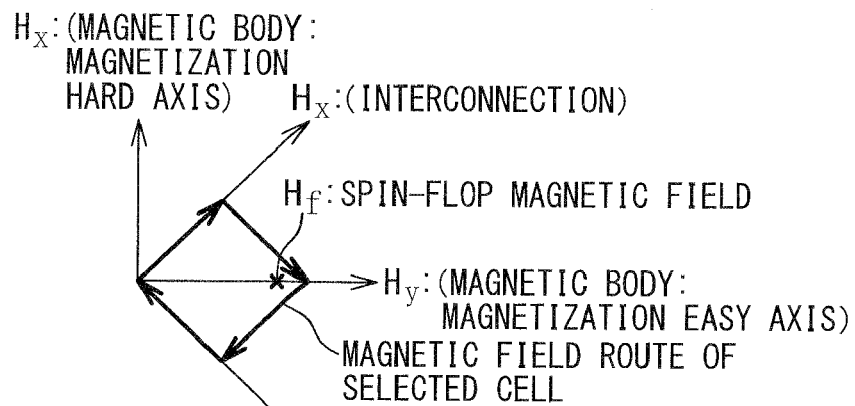
FIG. 3A is the graph showing the trajectory of the writing magnetic field induced by a write current.
Figure 3B:
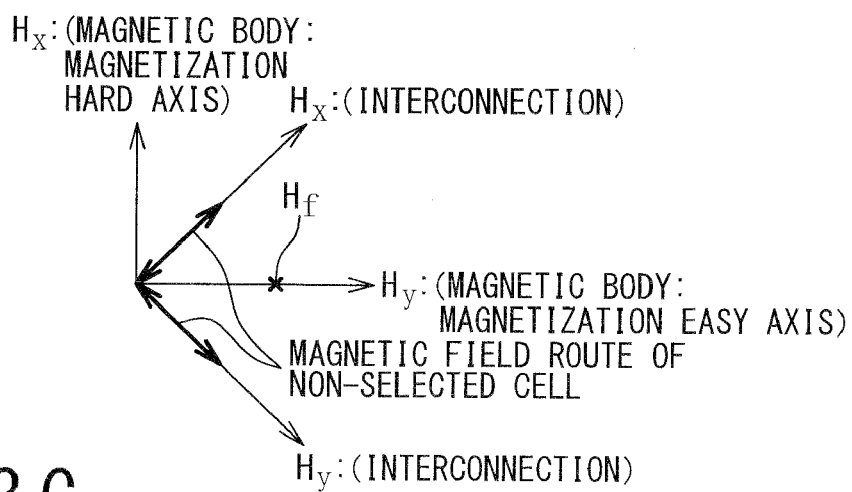
FIG. 3B is the graph showing the trajectory of the writing magnetic field induced by a write current.
Figure 3C:
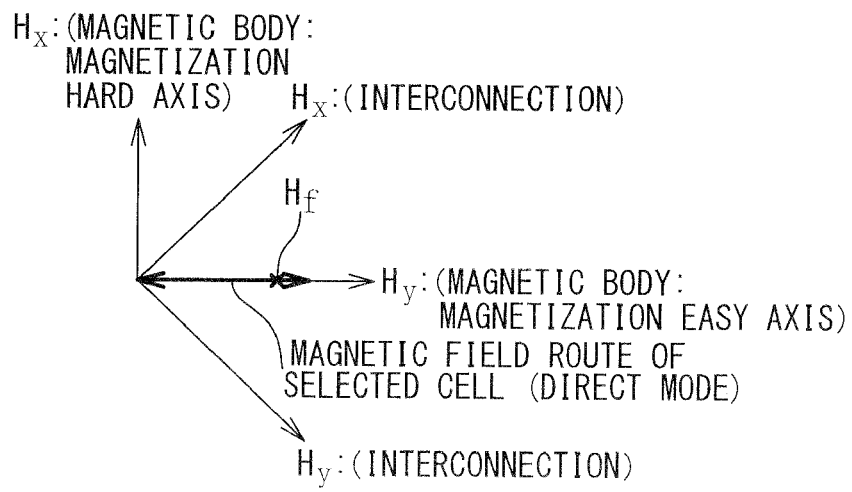
FIG. 3C is the graph showing the trajectory of the writing magnetic field induced by a write current.
Figure 4:
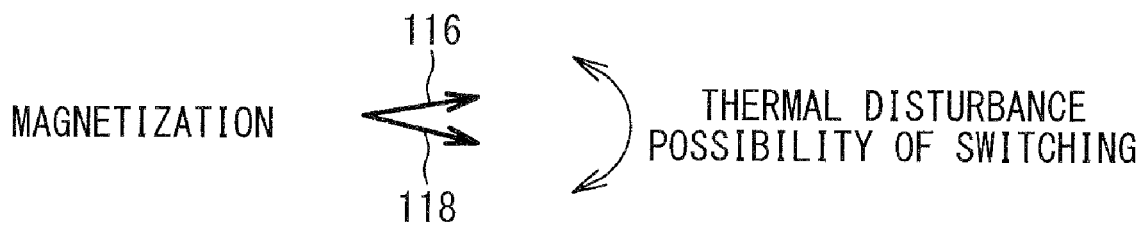
FIG. 4 is a conceptual view showing the saturation of the magnetization of a laminated ferri structure.

For example, when an MTJ element 10 is assumed to have the configuration of the magnetoresistive element 125 in FIG. 1, the state in which the magnetization of the ferromagnetic layer 118 of the free layer 111 and the magnetization of the ferromagnetic layer 119 of the pinned layer 113 arranged with the tunnel insulating layer 112 between them are parallel to each other is [0], and this is the low resistance state of, for example, 20 kΩ. The state in which they are anti-parallel to each other is [1], and this is the high resistance state of, for example, 24 kΩ, when the MR ratio is assumed to be 20%. The application of the external magnetic field has influence on the magnetization of the ferromagnetic layer 118, and the orientation of the magnetization of the ferromagnetic layer 118 is changed. Accordingly thereto, the magnetoresistive element 125 becomes in a state that is not [0] nor [1]. At this time, the resistance value is in an intermediate state between 20 kΩ and 24 kΩ. Then, the orientation of the magnetization of the ferromagnetic layer 118 that is changed by the external magnetic field can be detected from the resistance value. For example, when the magnetization of the ferromagnetic layer 118 is orthogonal to the magnetization of the ferromagnetic layer 119, the resistance value becomes 22 kΩ. By checking the changes in the angles of the magnetizations in the MTJ elements 10-1 to 10-4, the angle of the external magnetic field can be determined.

However, when a magnetic field same to the flop magnetic field Hf of the MTJ element or more is applied, the direction dependency of each MTJ element 10 disappears. Thus, in the MTJ element 10 in the excessive magnetic field detecting section 4, the flop magnetic field Hf is desired to be set to be greater than the MTJ element (magnetoresistive element) in the magnetic memory cell 20.

Figure 11:
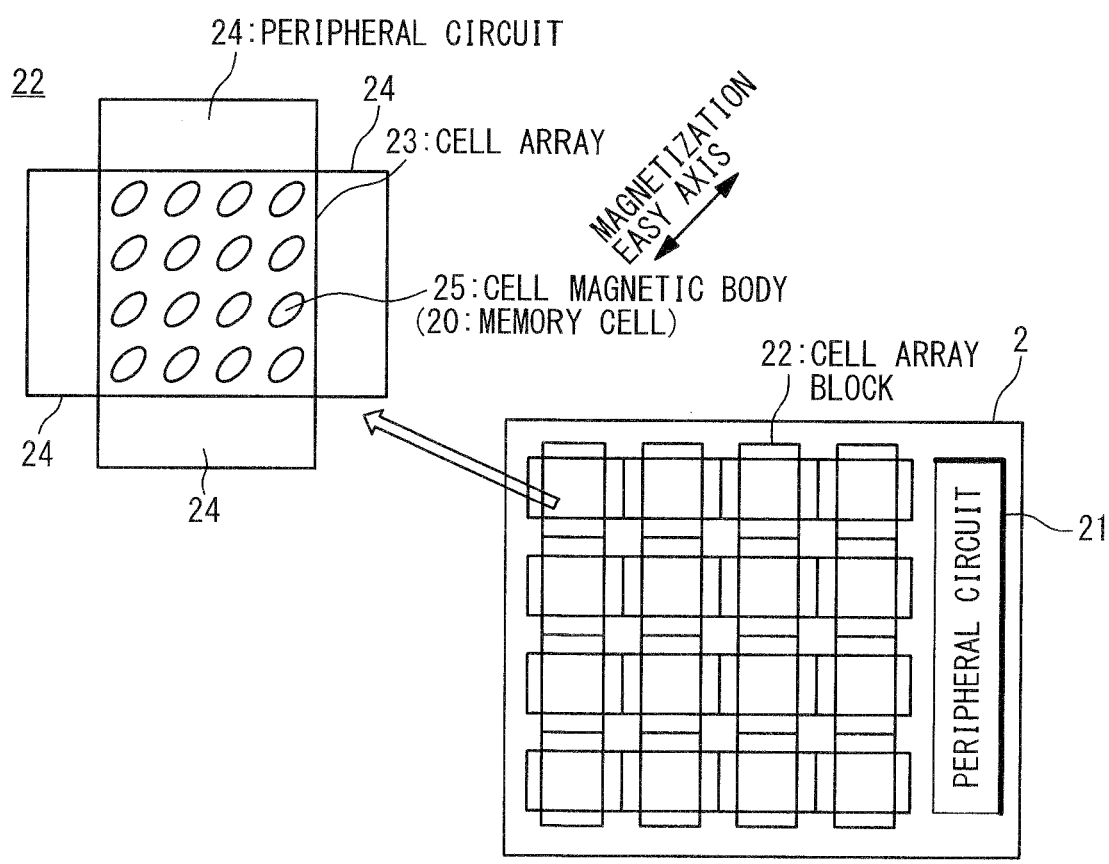
FIG. 11 is a schematic view showing the configuration of the memory body in an embodiment of the MRAM of the present invention.

FIG. 11 is a schematic view showing the configuration of the memory body 2 in an embodiment of the MRAM of the present invention. The memory body 2 contains a peripheral circuit 21 and a plurality of cell array blocks 22. The peripheral circuit 21 is connected to the output section 3 and the excessive magnetic field detecting section 4. This is a circuit for operating the plurality of cell array blocks 22 and stopping the operation of the memory body 2, in response to the magnetic field detecting signal. The cell array block 22 includes a cell array 23 and peripheral circuit 24. The cell array 23 includes the plurality of magnetic memory cells 20 arrayed in a matrix. The magnetic memory cell 20 includes a cell magnetic body 25 as the magnetoresistive element, which includes the free layer, the tunnel insulating layer, the pinned layer and the anti-ferromagnetic layer. The free layer and the pinned layer are the laminated ferri structure bodies. The peripheral circuit 24 includes a circuit related to the execution of the writing operation and reading operation of the magnetic memory cell 20.

Figure 12:
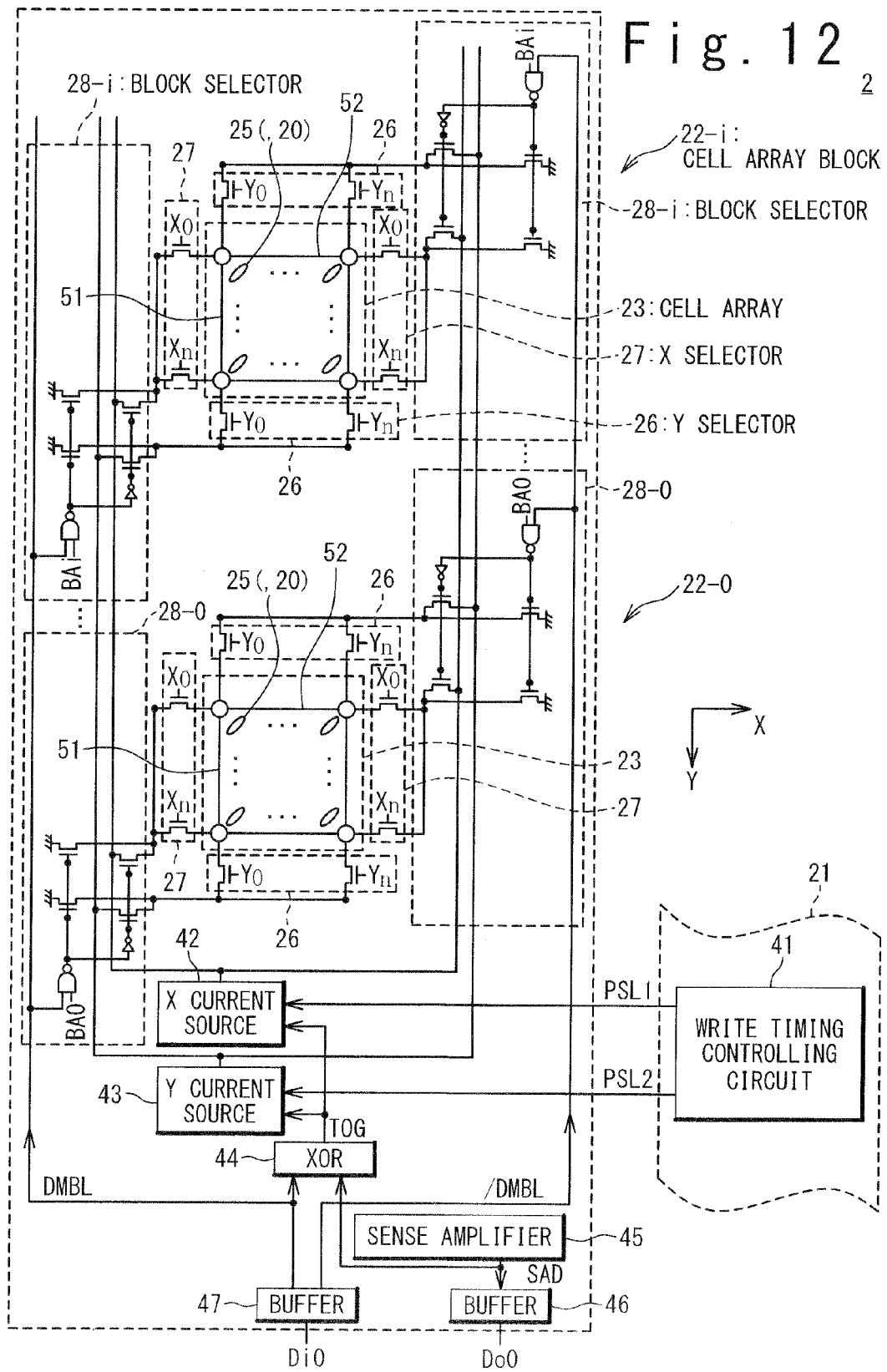
FIG. 12 is a circuit block diagram showing the configuration of the memory body in an embodiment of the MRAM of the present invention.

In the memory body 2, the cell arrays 23 are arranged to be separated from each other. Consequently, the influence of the parasitic resistance and parasitic capacitance of the interconnections can be suppressed, thereby improving the property and operation margin of the circuit. FIG. 12 is the circuit block diagram showing the configuration of the memory body 2 in an embodiment of the MRAM of the present invention. Here, an example of a part of the peripheral circuit 21 and a part of one column of the plurality of the cell array blocks 22 is illustrated. Here, only a circuit relating to the writing operation is demonstrated.

A write timing controlling circuit 41 which is a part of the peripheral circuit 21 outputs write control signals PLS1 and PLS2 for driving an X current source 42 and a Y current source 43, in response to a control signal from a controller (not shown in the drawings) in the peripheral circuit 21.

Each cell array block 22 includes the cell array 23 and the peripheral circuit 24. The peripheral circuit 24 of the cell array block 22 includes an X-selector 27, a Y-selector 26 and a block selector 28. A part of the peripheral circuits 24 further includes an X current source 42, a Y current source 43, a sense amplifier 45, buffer circuits 46, 47 and an XOR circuit 44.

The cell array 23 contains: a plurality of write word lines 52, a plurality of write bit lines 51, and a plurality of memory cells 20 including the cell magnetic body 25. The magnetic memory cell 20 is installed at each of the intersections of the plurality of write word lines 52 and the plurality of write bit lines 51.

The X-selector 27 selects a selected write word line 52 from the plurality of write word lines 52, in accordance with any of word line selection signals X0, - - - , Xn from the controller (not shown in the drawings) in the peripheral circuit 21. The Y-selector 26 selects the selected write bit line 51 from the plurality of write bit lines 51, in accordance with any of bit line selection signals Y0, - - - , Yn from the controller (not shown in the drawings) in the peripheral circuit 21. The block selector 28-$i$ (i=0 to n: n+1 is the number of the cell array blocks 22 in one column) selects the cell array block 22-$i$, in response to a block selection signal BAi from the controller (not shown in the drawings) in the peripheral circuit 21.

The X current source 42 is the current source for the write word line 52. The Y current source 43 is the current source for the write bit line 51. The X current source 42 and the Y current source 43 are shared by the plurality of cell array blocks 22-0 to 22-$n$. The sense amplifier 17 outputs a read data SAD, which is read from the magnetic memory cell 20, to a buffer circuit 46 and the XOR circuit 44. The buffer circuit 47 stores a write data Di0 sent from the outside. Then, at a predetermined timing, the write data Di0 is outputted to the XOR circuit 44. The buffer circuit 46 stores the read data SAD sent from a sense amplifier 45. And the buffer circuit 46 outputs the read data SAD to the outside as a read data Do0 at a predetermined timing. The XOR circuit 44 compares the write data Di0 from the buffer circuit 47 and the read data SAD from the sense amplifier 45, and when they are different to each other, outputs an allowance signal TOG for allowing the writing operation to the X current source 42 and the Y current source 43.

When the writing operation is performed, the X current source 42 outputs the write current IWWL in response to the write control signal PLS1 and the allowance signal TOG. The write current IWWL from the current source 42 is supplied through the block selector 28-$i$ and the X-selector 27 to the selected write word line 52. The Y current source 43 outputs the write current IWBL, in response to the write control signal PLS2 and the allowance signal TOG. The write current IWBL from the Y current source 43 is supplied through the block selector 28-$i$ and the Y-selector 26 to the selected write bit line 51.

Figure 13:
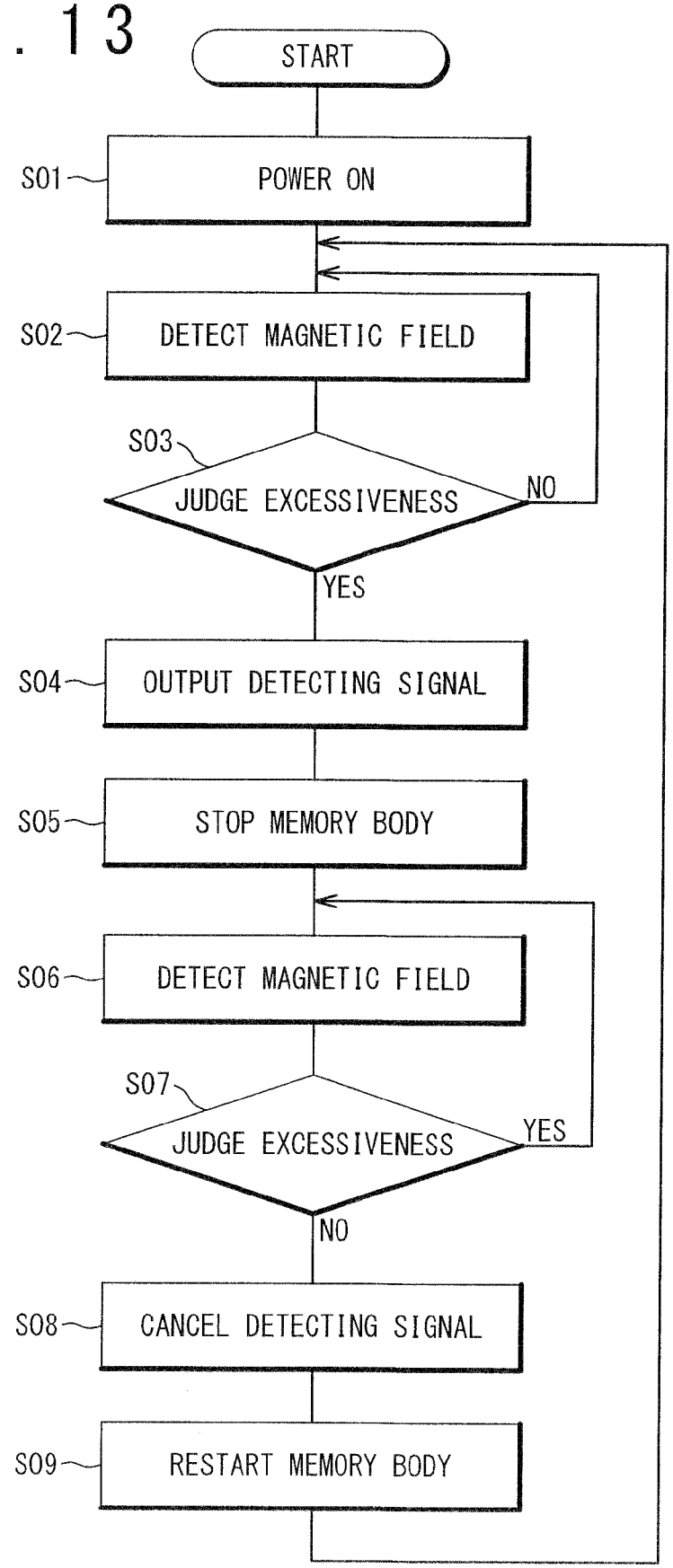
FIG. 13 is a flowchart showing the operations of the first embodiment of the MRAM of the present invention.

The operation of the first embodiment of the MRAM of the present invention will be described below. FIG. 13 is the flowchart showing the operation of the first embodiment of the MRAM of the present invention.

The power source of the main body of the system including the MRAM 1, for example, a PC (Personal Computer) is turned on (S01). In response to it, the excessive magnetic field detecting section 4 starts to detect the external magnetic field of the circumference area of the memory body 2 (S02). The excessive magnetic field detecting section 4 monitors whether or not the magnitude of the detected external magnetic field is greater than a predetermined magnitude (S03). If the magnitude of the detected external magnetic field is greater than the predetermined magnitude (S03: Yes), the excessive magnetic field detecting section 4 outputs the magnetic field detecting signal to the memory body 2 and the output section 3 (S04). As a result of it, the memory body 2 stops its operation (S05). The output section 3 outputs the magnetic field detecting signal to the CPU (interruption). As a result of it, the access of the CPU to the MRAM 1 is stopped. The excessive magnetic field detecting section 4 continues to output the magnetic field detecting signal to the memory body 2 and the output section 3.

The excessive magnetic field detecting section 4 continues to detect the external magnetic field of the circumference area of the memory body 2 (S06). The excessive magnetic field detecting section 4 monitors whether or not the magnitude of the detected external magnetic field is greater than the predetermined magnitude (S07). If the magnitude of the detected external magnetic field is less than the predetermined magnitude (S07: No), the excessive magnetic field detecting section 4 stops to output the magnetic field detecting signal to the memory body 2 and the output section 3 and cancels the magnetic field detecting signal (S08). As a result of it, the memory body 2 restarts its operation (S09). The output section 3 stops to output the magnetic field detecting signal to the CPU. As a result of it, the access of the CPU to the MRAM 1 restarts.

In the present invention, when the external magnetic field has a certain magnitude or more, the memory body 2 immediately stops its operations. Then, the output section 3 reports the stopping to the outside by the magnetic field detecting signal. Consequently, it is possible to prevent an erroneous writing inside the memory body 2. That is, in the MRAM 1 of the present invention, it is possible to prevent the writing from errors caused by the external magnetic field.

Figure 14:
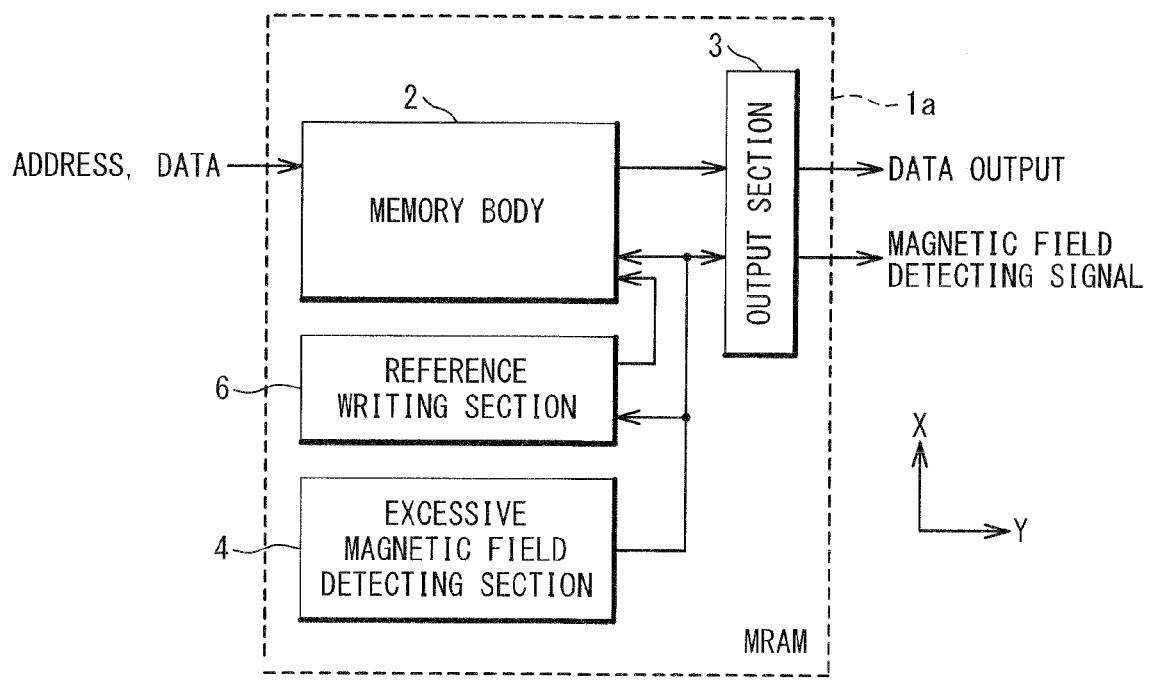
FIG. 14 is a block diagram showing the configuration of a variation of the first embodiment of the MRAM of the present invention.

The configuration of a variation of the first embodiment of the MRAM of the present invention will be described below. FIG. 14 is the block diagram showing the configuration of a variation of the first embodiment of the MRAM of the present invention. An MRAM 1$a$ contains a reference cell writing section 6, in addition to the memory body 2, the excessive magnetic field detecting section 4 and the output section 3. Here, the X-Y coordinates indicate the coordinate of the MRAM 1$a$.

When the external magnetic field which can be sensed by the excessive magnetic field detecting section 4 is applied, the possibility that the data in the memory body 2 is destructed is assumed to be significantly high. The data is checked through a predetermined method and the destructed data is discarded or fixed. However, when the data in the magnetic memory cell 20 is read out (exemplifications: at the time of the reading operation, at the time of the pre-reading at the time of the writing operation in the toggle MRAM), when the reference cell serving as a reference is broken, the MRAM does not function as the memory chip. Thus, before the MRAM returns to the normal operation, the reference cell is required to be surely recovered. In this embodiment, it is different from the case of FIG. 7A that the reference cell writing section 6 is installed in order to recover the reference cell.

The reference cell writing section 6 again writes (overwrites) a predetermined data, for all of the reference cells in the memory body 2, when the memory body 2 restarts the operation. Since the other configurations are same to the case of FIG. 7A, their explanations are omitted.

Figure 15:
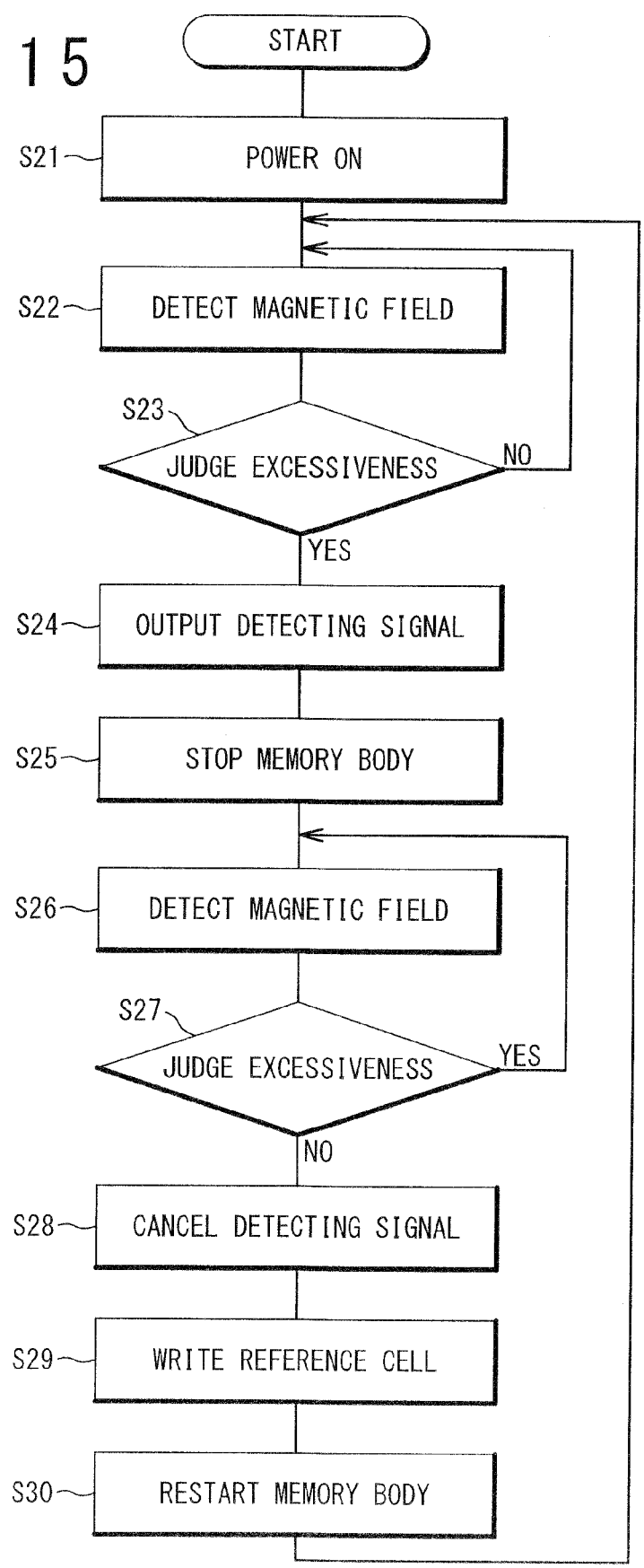
FIG. 15 is a flowchart showing the operations of a variation of the first embodiment of the MRAM of the present invention.

Another operation of the first embodiment of the MRAM of the present invention will be described below. FIG. 15 is the flowchart showing the operation of the variation in the first embodiment of the MRAM of the present invention.

Since S21 to S28 are similar to S01 to S08, their explanations are omitted. Since the output of the field detecting signal is canceled by the excessive magnetic field detecting section 4 (S28), the memory body 2 firstly executes the rewriting to the reference cell (S29). After that, the memory body 2 restarts its operation (S30). The output section 3, after the output of the field detecting signal is canceled by the excessive magnetic field detecting section 4 (S28), stops outputting the magnetic field detecting signal to the CPU, after the elapse of a predetermined time (corresponding to the rewrite time of the reference cell). As a result of it, the access of the CPU to the MRAM 1a is restarted.

Also, in this case, the effects similar to the case of FIG. 7A can be achieved. In addition, since the reference cell is fixed, the MRAM can be surely operated as a memory chip, and the reliability can be improved.

Second Embodiment

Figure 16:
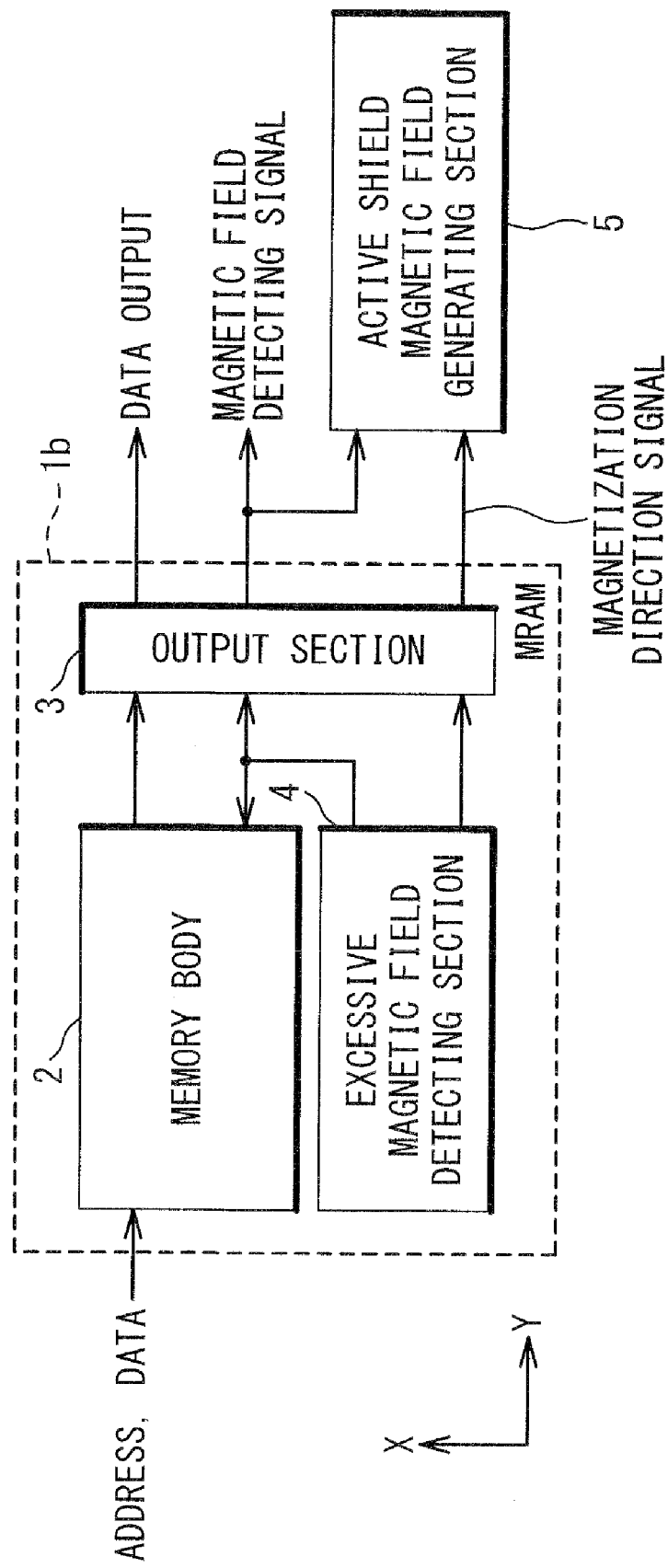
FIG. 16 is a block diagram showing the configuration of the second embodiment of the MRAM of the present invention.

The configuration of the second embodiment of the MRAM of the present invention will be described below. FIG. 16 is a block diagram showing the configuration of the second embodiment of the MRAM of the present invention. An MRAM 1b contains the memory body 2, the excessive magnetic field detecting section 4, the output section 3 and an active shield magnetic field generating section 5. Here, the X-Y coordinate indicates the coordinate in the MRAM 1b.

This embodiment differs from the first embodiment in that a magnetic field direction signal indicating the direction of the external magnetic field is outputted to the excessive magnetic field detecting section 4, and that the active shield magnetic field generating section 5 for generating a shielding magnetic field to invalidate the component, which may destruct the data stored in a cell in the external magnetic field is provided with.

The active shield magnetic field generating section 5 includes an active shield magnetic field section and a peripheral circuit (not shown in the drawings). The active shield magnetic field section is, for example, a plurality of coils (active shield coils) that are oriented to the directions different from each other. By supplying a current to any of the active shield coils in accordance with the direction of the external magnetic field, the active shield coils functions as electric magnets, and the influence of the external magnetic field is suppressed. The peripheral circuit includes: a selecting switch for selecting any of the plurality of active shield coils, in response to the magnetic field detecting signal and the magnetic field direction signal; and a power source for supplying a current to the selected coil.

That is, the excessive magnetic field detecting section 4 outputs the magnetic field direction signal through the output section 3 to the active shield magnetic field generating section 5, in addition to the operation described in the first embodiment. The magnetic field direction signal indicates the direction of the external magnetic field. The method for determining the direction of the external magnetic field is as described in the explanations of FIGS. 8A to 8D, 9, and 10A to 10C. The active shield magnetic field generating section 5 generates a magnetic field (active shield magnetic field) to invalidate the component that may destruct the data stored in a cell in the external magnetic field, so that the magnetization inversion in the magnetic memory cell 20 is made hard. For example, it generates the magnetic field (active shield magnetic field) having a certain magnitude and a certain direction so that the synthesized magnetic field with the external magnetic field does not destruct the data stored in a cell is not destructed. As a result of that, the synthesis magnetic field of the external magnetic field and the active shield magnetic field does not have the component that may destruct the data stored in a cell and the data is kept.

However, the magnetic field direction signal may indicate the generation direction of the active shield magnetic field Hs. In this case, the excessive magnetic field detecting section 4 determines the direction of the active shield magnetic field in which the magnetization inversion in the magnetic memory cell 20 is made hard.

The other configurations in the MRAM 1b are same to those of the first embodiment and their explanations are omitted.

Figure 17:
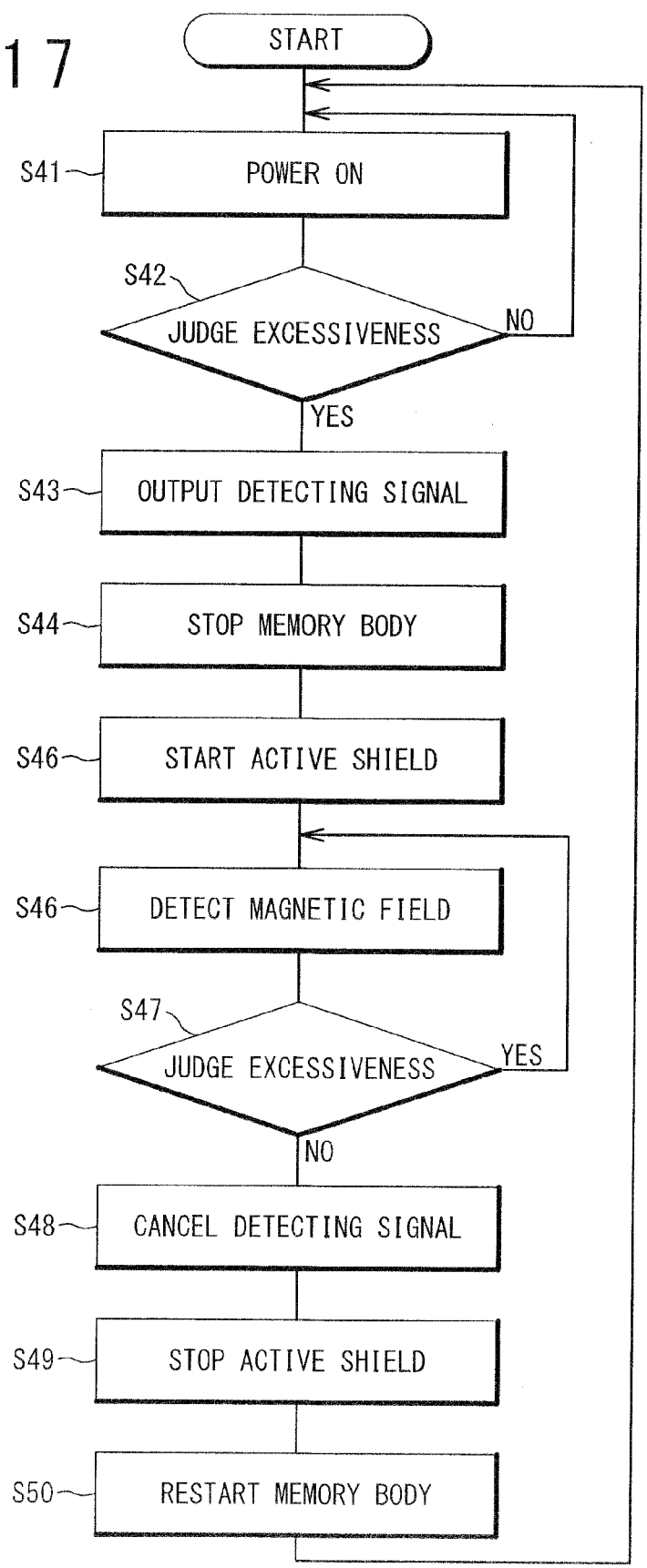
FIG. 17 is a flowchart showing the operations of the second embodiment of the MRAM of the present invention.

The operation of the second embodiment of the MRAM of the present invention will be described below. FIG. 17 is the flowchart showing the operation of the second embodiment of the MRAM of the present invention.

The power source of the main body of the system including the MRAM 1, for example, a PC (Personal Computer) is turned on. In response to it, the excessive magnetic field detecting section 4 starts to detect the external magnetic field of the circumference area of the memory body 2 (S41). The excessive magnetic field detecting section 4 monitors whether or not the magnitude of the detected external magnetic field is greater than a predetermined magnitude (S42). If the magnitude of the detected external magnetic field is greater than the predetermined magnitude (S42: Yes), the excessive magnetic field detecting section 4 outputs the magnetic field detecting signal to the memory body 2 and the output section 3 (S43). As a result of it, the memory body 2 stops its operation (S44). The output section 3 outputs the magnetic field detecting signal to the CPU (interruption). As a result of it, the access of the CPU to the MRAM 1 is stopped. The excessive magnetic field detecting section 4 outputs the magnetic field direction signal together with the magnetic field detecting signal to the output section 3. The output section 3 outputs the magnetic field detecting signal and the magnetic field direction signal to the active shield magnetic field generating section 5. The active shield magnetic field generating section 5 generates the magnetic field (active shield magnetic field) to invalidate the component that may destruct the data stored in a cell in the external magnetic field so that the magnetization inversion in the magnetic memory cell 20 is made hard, in accordance with the magnetic field detecting signal and the magnetic field direction signal from the output section 3 (S45). The excessive magnetic field detecting section 4 continues to output the magnetic field detecting signal to the memory body 2, the output section 3 and the active shield magnetic field generating section 5. The magnetic field direction signal continues to be outputted through the output section 3 to the active shield magnetic field generating section 5.

The excessive magnetic field detecting section 4 continues to detect the external magnetic field of the circumference area of the memory body 2 (S46). The excessive magnetic field detecting section 4 monitors whether or not the magnitude of the detected external magnetic field is greater than the predetermined magnitude (S47). If the magnitude of the detected external magnetic field is less than the predetermined magnitude (S47: No), the excessive magnetic field detecting section 4 stops to output the magnetic field detecting signal to the memory body 2 and the output section 3 and cancels the magnetic field detecting signal (S48). Together with it, the excessive magnetic field detecting section 4 stops to output the magnetic field direction signal and cancels the magnetic field direction signal. Since the magnetic field detecting signal and the magnetic field direction signal are canceled, the active shield magnetic field generating section 5 stops the magnetic field (active shield magnetic field) (S49). As a result of it, the memory body 2 restarts its operation (S50). The output section 3 stops to output the magnetic field detecting signal to the CPU. As a result of it, the access of the CPU to the MRAM 1b restarts.

In the present invention, when the external magnetic field has a certain magnitude or more, the memory body 2 immediately stops its operations. Then, the output section 3 reports the stopping to the outside by the magnetic field detecting signal. Consequently, it is possible to prevent the erroneous writing inside the memory body 2. Also, it is also possible to prevent the data in the memory body 2 from being destructed. That is, in the MRAM 1b of the present invention, it is possible to prevent the erroneous operation and the data destruction, which are caused by the external magnetic field.

Here, when the magnetic memory cell 20 is the toggle cell and when the MRAM 1b is the toggle MRAM, the active shield magnetic field generating section 5 can be simply configured.

Figure 18:
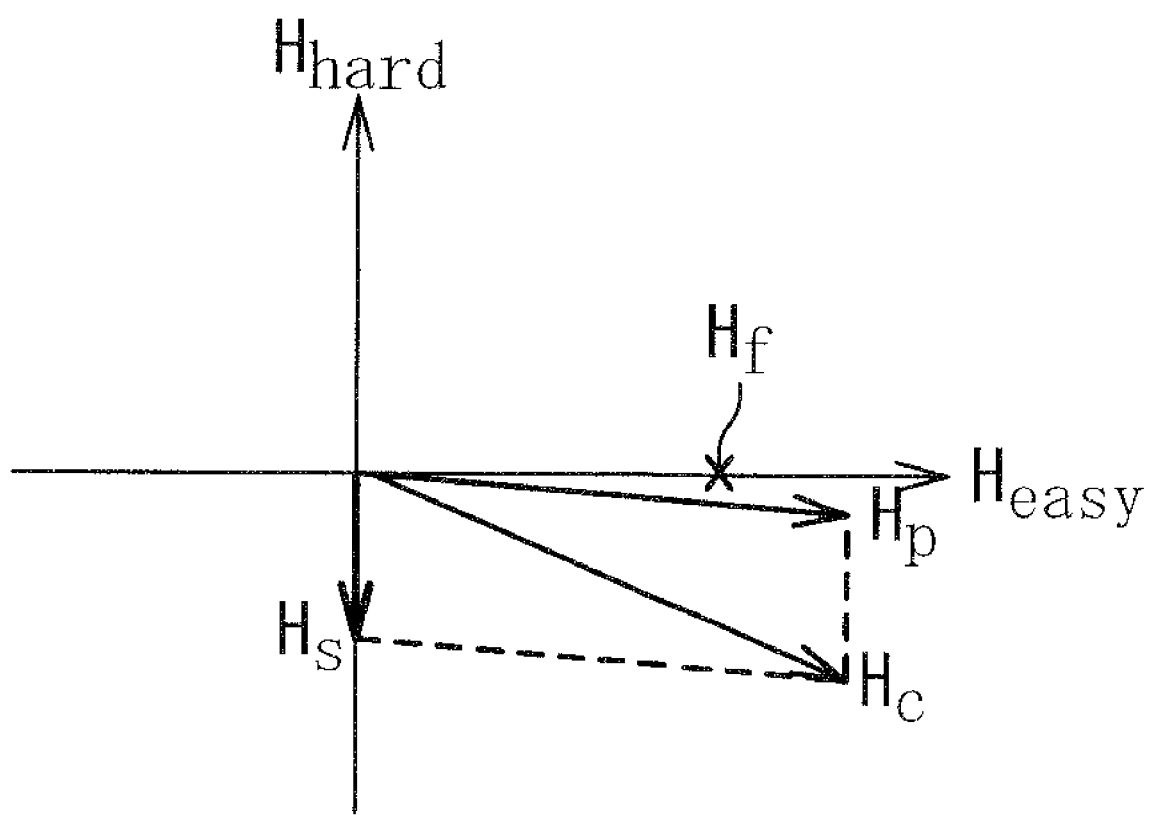
FIG. 18 is a view showing the principle for explaining an active shield magnetic field to be generated by an active magnetic field generator, in order to prevent an external magnetic field near the flop magnetic field Hf.

FIG. 18 is a view for explaining the principle of the active shield magnetic field to be generated by the active magnetic field generator, in order to prevent the external magnetic field near the flop magnetic field Hf. Here, let us consider an external magnetic field HD directed to the third quadrant and the fourth quadrant. FIG. 18 shows the active shield magnetic field Hs when the angle between the direction of the external magnetic field HD and the direction of the flop magnetic field Hf is small (45 degrees or less). The longitudinal axis indicates the magnetization hard axis direction (Hhard), and the lateral axis indicates the magnetization easy axis direction (Heasy).

In the toggle cell, without passing near the flop magnetic field Hf, the magnetization is not inverted. For this reason, only when the external magnetic field HD having a large magnitude is detected and its direction is equal to or less than 45 degree with respect to the magnetization easy axis direction, the active shield magnetic field Hs is applied to the magnetization hard axis direction (the − direction, in this case). Thus, a synthesized magnetic field Hc of the external magnetic field HD and the active shield magnetic field Hs are kept away from the flop magnetic field Hf. Hence, it is possible to avoid the magnetization inversion of the magnetic memory cell 20. That is, in order that the magnetization inversion in the magnetic memory cell 20 is not generated and the data is not destructed, the active shield magnetic field Hs is required to be applied to the magnetization hard axis direction (the − direction, in this case).

On the other hand, when a large external magnetic field HD is detected and its direction is greater than 45 degree, it is far away from the flop magnetic field Hf. Thus, the magnetization of the magnetic memory cell 20 is not inverted. That is, in order that the magnetization inversion in the magnetic memory cell 20 is not generated and the data is not destructed, the active shield magnetic field Hs is not required.

FIG. 18 shows the example in which the external magnetic field HD is directed to the third quadrant and the fourth quadrant. However, even the case that it is directed to the first quadrant or the second quadrant can be similarly considered.

Figure 19A:
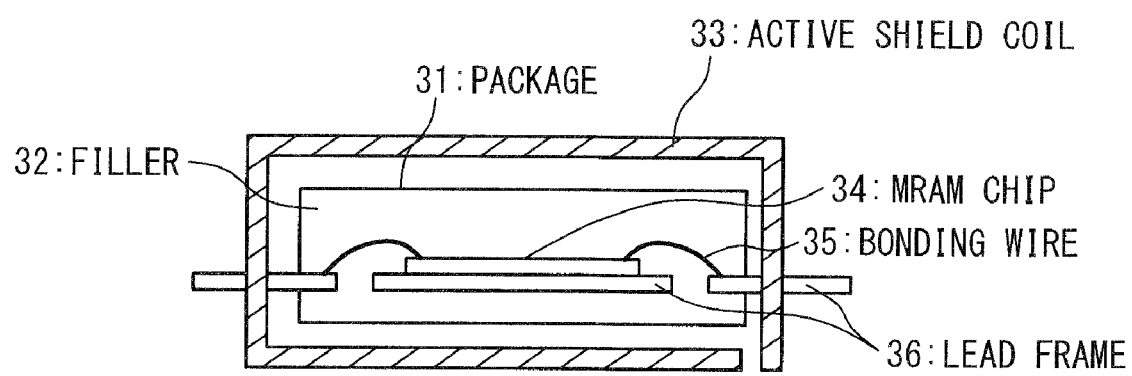
FIG. 19A is a schematic view showing another configuration of the second embodiment of the MRAM of the present invention.
Figure 19B:
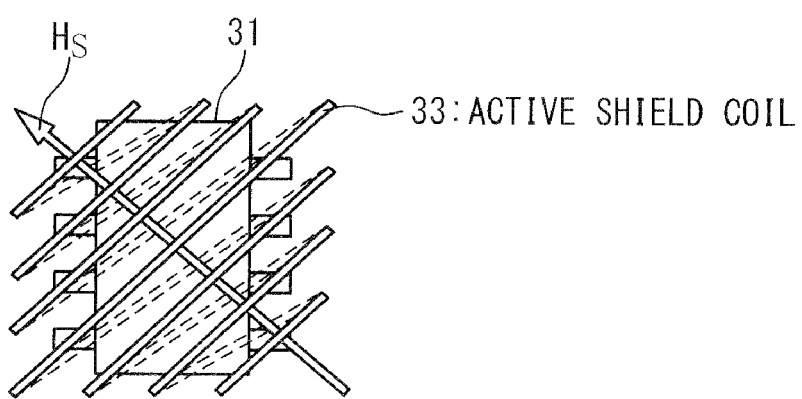
FIG. 19B is a schematic view showing another configuration of the second embodiment of the MRAM of the present invention.

FIG. 19A to FIG. 19B are the schematic views showing another configuration of the second embodiment of the MRAM of the present invention. FIG. 19A is a schematic view of a section, and FIG. 19B is the plan view. The MRAM contains: a package 31 that includes therein a filler 32, an MRAM chip 34, bonding wires 35 and lead frames 36; and an active shield coil 33 which is a conductor (wiring) placed to surround around the package 31 helically (in coiled shape). The active shield coil 33 is included in the active shield magnetic field generating section 5 and generates the active shield magnetic field Hs in the magnetization hard axis direction, through the electromagnetic inducing action. The active shield coil 33 is controlled by the other part of the active shield magnetic field generating section 5 to generate an active shield magnetic field Hs to have a controlled magnitude and direction. The direction (the arrow mark in FIG. 19B) is set to coincide with the magnetization hard axis direction (the + orientation or − direction) of the magnetic memory cell 20. The direction (+ orientation or − direction) of the active shield magnetic field Hs is controlled by the direction of the current.

Figure 6:
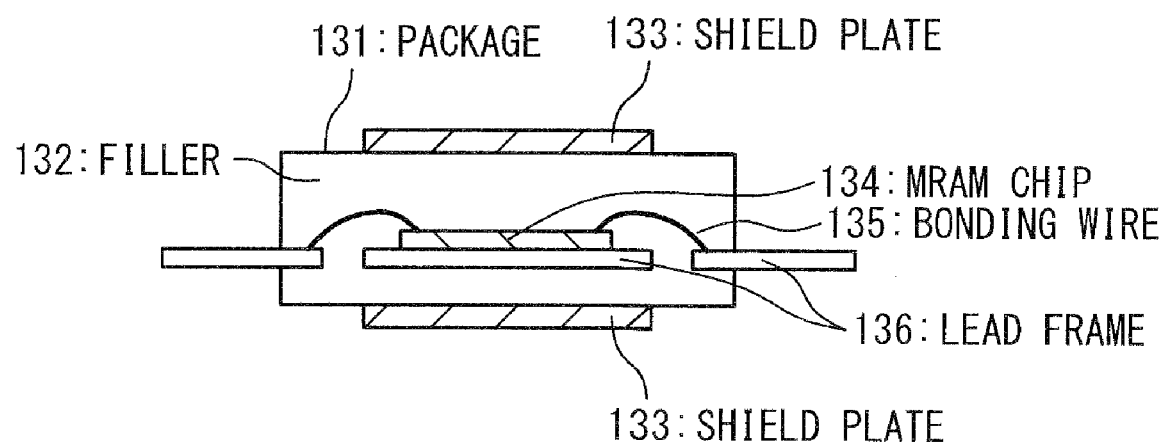
FIG. 6 is a sectional view showing the MRAM to which this conventional data protecting means is applied.

In this method, the MRAM can be shielded, only by generating the active shield magnetic field Hs in the magnetization hard axis direction. Thus, by wrapping the active shield coil 33 around the package 31 as shown in FIG. 6, it is possible to shield the external magnetic field HD at various angles.

With regard to the MRAM of the present invention as shown in FIG. 19A to FIG. 19B, the operation shown in the graph in FIG. 18 will be described below. FIG. 20 is the flowchart showing another operation in the second embodiment of the MRAM of the present invention.

The power source of the main body of the system including the MRAM 1, for example, a PC (Personal Computer) is turned on. In response to it, the excessive magnetic field detecting section 4 starts to detect the external magnetic field of the circumference area of the memory body 2. Then, the angle and magnitude of the external magnetic field are calculated by computing (S61). The excessive magnetic field detecting section 4 monitors whether or not the magnitude of the detected external magnetic field is greater than a predetermined magnitude (S62). If the magnitude of the detected external magnetic field is equal to or greater than the predetermined magnitude (S62: Yes), the excessive magnetic field detecting section 4 judges whether or not the angle between the direction of the external magnetic field and the magnetization easy axis direction is 45 degree or less (S63). In the case of 45 degree or less (S63; Yes), the magnetic field detecting signal is outputted to the memory body 2 and the output section 3. As a result of it, the memory body 2 stops its operation. The output section 3 outputs the magnetic field detecting signal to the CPU. Thus, the access of the CPU to the MRAM 1 is stopped. In addition, the output section 3 outputs the magnetic field detecting signal to the active shield magnetic field generating section 5. Simultaneously, the excessive magnetic field detecting section 4 outputs the magnetic field direction signal, which indicates the generation direction of the active shield magnetic field Hs, through the output section 3 to the active shield magnetic field generating section 5 (S64). As a result of it, the active shield magnetic field generating section 5 generates the magnetic field (active shield magnetic field Hs) through the active shield coil 33, in such a way that the occurrence of the magnetization inversion in the magnetic memory cell 20 is prevented and the data is not destructed, in accordance with the magnetic field detecting signal and the magnetic field direction signal (S66). In the case of 45 degree or more (S63: No), the magnetic field detecting signal is outputted to the memory body 2 and the output section 3. As a result of it, the memory body 2 stops its operation. However, the output section 3 does not output the magnetic field detecting signal to the active shield magnetic field generating section 5.

As a result of it, the active shield magnetic field Hs through the active shield coil 33 is not generated. This is because, since the magnetization in the magnetic memory cell 20 is not inverted, the active shield magnetic field Hs is not required. The excessive magnetic field detecting section 4 continues to output the magnetic field detecting signal to the memory body 2 and the output section 3. The magnetic field direction signal continues to be outputted through the output section 3 to the active shield magnetic field generating section 5.

The excessive magnetic field detecting section 4 detects the external magnetic field of the circumference area of the memory body 2. Then, the angle and magnitude of the external magnetic field are calculated by computing (S67). The excessive magnetic field detecting section 4 monitors whether or not the magnitude of the detected external magnetic field is greater than the predetermined magnitude (S68). If the magnitude of the detected external magnetic field is equal to or greater than the predetermined magnitude (S68: Yes), the excessive magnetic field detecting section 4 judges whether or not the angle between the direction of the external magnetic field and the magnetization easy axis direction is 45 degree or less (S69). In the case of 45 degree or less (S69; Yes), the output section 3 outputs the magnetic field detecting signal to the active shield magnetic field generating section 5. Simultaneously, the excessive magnetic field detecting section 4 outputs the magnetic field direction signal through the output section 3 to the active shield magnetic field generating section 5 (S71). As a result of it, the active shield magnetic field generating section 5 is able to generate the magnetic field (active shield magnetic field Hs) through the active shield coil 33 in such a way that the occurrence of the magnetization inversion in the magnetic memory cell 20 is prevented and the data is not destructed, in accordance with the magnetic field detecting signal and the magnetic field direction signal (S66). In the case of 45 degree or more (S69: No), the output section 3 does not output the magnetic field detecting signal to the active shield magnetic field generating section 5 (S70). As a result of it, the active shield magnetic field Hs is not generated through the active shield coil 33. This is because since the magnetization in the magnetic memory cell 20 is not inverted, the active shield magnetic field Hs is not required. Again, the angle and magnitude of the external magnetic field are calculated by computing (S67). If the magnitude of the external magnetic field is smaller than the predetermined magnitude (S68: No), the excessive magnetic field detecting section 4 stops to output the magnetic field detecting signal to the memory body 2 and the output section 3 and cancels the magnetic field detecting signal (S72). Together with it, the excessive magnetic field detecting section 4 stops outputting the magnetic field direction signal and cancels the magnetic field direction signal. Since the magnetic field detecting signal and the magnetic field direction signal are canceled, the active shield magnetic field generating section 5 stops the magnetic field (active shield magnetic field Hs) (S73). As a result of it, the memory body 2 restarts its operation (S74).

The output section 3 stops to output the magnetic field detecting signal to the CPU. As a result of it, the access of the CPU to the MRAM 1b is restarted.

As mentioned above, with the active shield magnetic field generating section 5 having the simple configuration, it is possible to prevent the erroneous writing inside the memory body 2, and it is also possible to protect the data in the memory body 2 from being destructed.

In the MRAM in FIG. 19A to FIG. 19B, it is possible to prevent the external magnetic field near the flop magnetic field Hf, and it is also possible to protect the magnetic memory cell magnetization from being saturated by a giant magnetic field in the magnetization hard axis direction.

Figure 21:
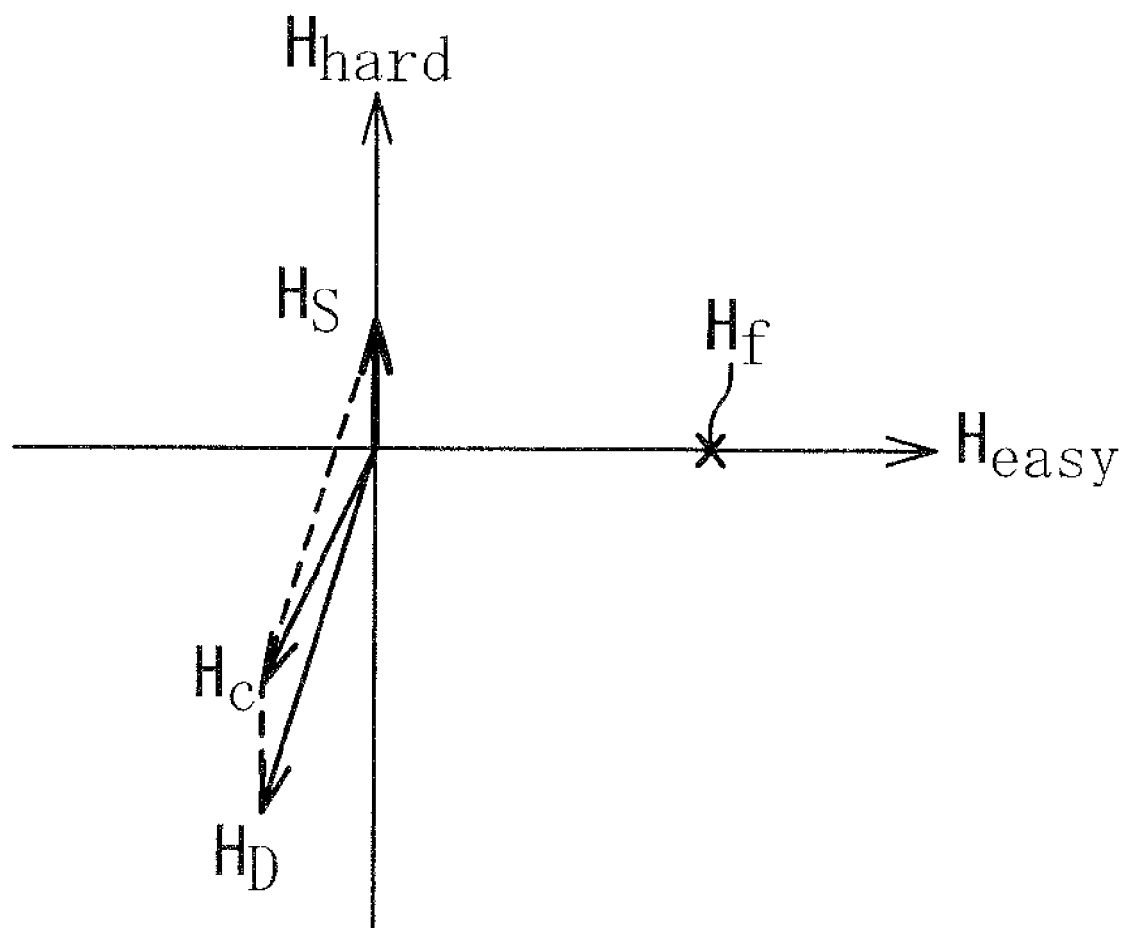
FIG. 21 is a view showing the principle for explaining the active shield magnetic field to be generated by the active magnetic field generator, in order to prevent the magnetic memory cell magnetization from being saturated by a large magnetic field in a magnetization hard axis direction.

FIG. 21 is a view for explaining the principle of the active shield magnetic field to be generated by the active magnetic field generator, in order to protect the magnetic memory cell magnetization from being saturated by a giant magnetic field in the magnetization hard axis direction. Here, let us consider the external magnetic field HD directed to the third quadrant and the fourth quadrant. FIG. 21 shows the active shield magnetic field Hs when the angle between the direction of the external magnetic field HD and the direction of the flop magnetic field Hf is large (45 degree or more). The longitudinal axis indicates the magnetization hard axis direction (Hhard), and the lateral axis indicates the magnetization easy axis direction (Heasy).

In the toggle cell, without passing near the flop magnetic field Hf, the magnetization is not inverted. Thus, when a large external magnetic field HD is detected and its direction is larger than 45 degree, this is far away from the flop magnetic field Hf. Hence, the magnetization in the magnetic memory cell 20 is not inverted. However, if the magnitude of the external magnetic field HD is sufficiently large, there is a case that this exceeds the saturated magnetic field Hsat. Also in the case, the magnetization direction of the magnetic memory cell 20 becomes unstable, which may bring about a possibility that the data is destructed. In order to treat with it, as shown in FIG. 21, the active shield magnetic field Hs directed to the first quadrant or second quadrant in the approximately opposite direction is applied to the external magnetic field HD directed to the third quadrant or fourth quadrant.

As a result of this, the synthesized magnetic field Hc of the external magnetic field HD and the active shield magnetic field Hs becomes smaller than the external magnetic field HD. Thus, it is possible to avoid the magnetization in the magnetic memory cell 20 from being saturated. That is, the active shield magnetic field Hs that is different from the case (the case in FIG. 18) when the external magnetic field in the flop magnetic field Hf direction is applied to relax the magnetization saturation in the magnetic memory cell 20, with regard to the external magnetic field HD in the magnetization hard axis direction. In this case, for example, it is possible to use the active shield coil (not shown in the drawings) vertical to the active shield coil 33 shown in FIG. 19A to FIG. 19B.

FIG. 21 shows an example in which the external magnetic field HD is directed to the third quadrant and the fourth quadrant. However, the case in which it is directed to the first quadrant and the second quadrant can be similarly considered.

Figure 22:
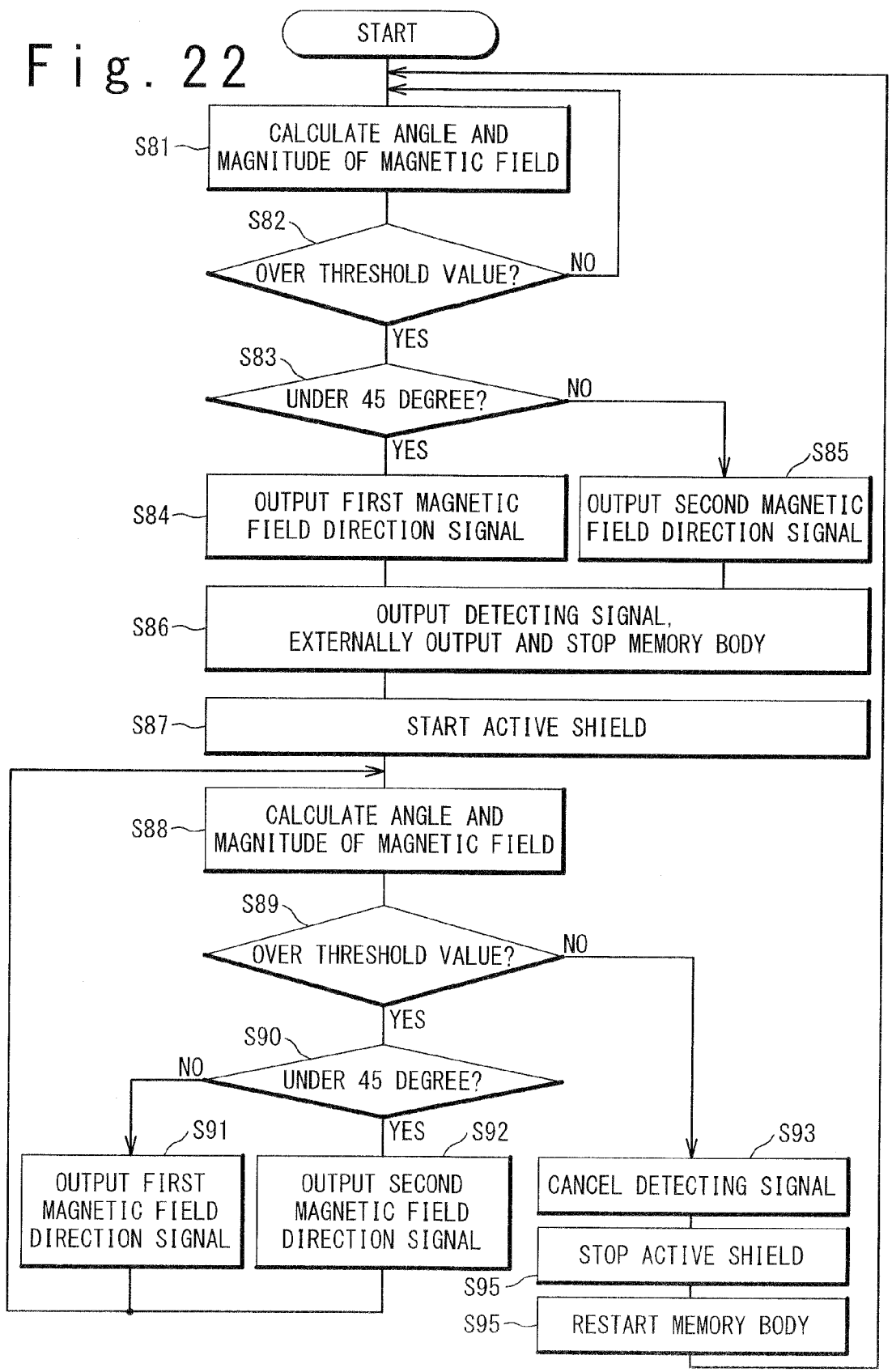
FIG. 22 is a flowchart showing still another operation of the second embodiment of the MRAM of the present invention.

The operation shown in the graph in FIG. 21 will be described below, with regard to the MRAM (including the active shield coil vertical to the active shield coil 33 (not shown in the drawings)) of the present invention, as shown in FIG. 19A to FIG. 19B. FIG. 22 is the flowchart showing still another operation in the second embodiment of the MRAM of the present invention.

The power source of the main body of the system including the MRAM 1, for example, a PC (Personal Computer) is turned on. In response to it, the excessive magnetic field detecting section 4 starts to detect the external magnetic field of the circumference area of the memory body 2. Then, the angle and magnitude of the external magnetic field are calculated by computing (S81). The excessive magnetic field detecting section 4 monitors whether or not the magnitude of the detected external magnetic field is greater than a predetermined magnitude (S82). If the magnitude of the detected external magnetic field is equal to or greater than the predetermined magnitude (S82: Yes), the excessive magnetic field detecting section 4 judges whether or not the angle between the direction of the external magnetic field and the magnetization easy axis direction is 45 degree or less (S83). In the case of 45 degree or less (S83; Yes), the excessive magnetic field detecting section 4 outputs a first magnetic field direction signal (indicating the case of 45 degree or less) through the output section 3 to the active shield magnetic field generating section 5 (S84). In the case greater than 45 degree (S83: No), the excessive magnetic field detecting section 4 outputs a second magnetic field direction signal (indicating the case greater than 45 degrees) through the output section 3 to the active shield magnetic field generating section 5 (S85). Simultaneously, the excessive magnetic field detecting section 4 outputs the magnetic field detecting signal to the memory body 2 and the output section 3. As a result of it, the memory body 2 stops its operation. The output section 3 outputs the magnetic field detecting signal to the CPU. Thus, the access of the CPU to the MRAM 1 is stopped (S86). In addition, the output section 3 outputs the magnetic field detecting signal to the active shield magnetic field generating section 5. The active shield magnetic field generating section 5, when receiving the first magnetic field direction signal, generates the magnetic field (the active shield magnetic field Hs: the direction shown in FIG. 18) through the active shield coil 33, in such a way that the occurrence of the magnetization inversion in the magnetic memory cell 20 is prevented and the data is not destructed, in accordance with the magnetic field detecting signal and the first magnetic field direction signal (S87). Also, the active shield magnetic field generating section 5, when receiving the second magnetic field direction signal, generates the magnetic field (the active shield magnetic field Hs: the direction shown in FIG. 21) through the active shield coil 33, in such a way that the occurrence of the magnetization inversion in the magnetic memory cell 20 is prevented and the data is not destructed, in accordance with the magnetic field detecting signal and the second magnetic field direction signal (S87). The excessive magnetic field detecting section 4 continues to output the magnetic field detecting signal to the memory body 2 and the output section 3. The first or second magnetic field direction signal continues to be outputted through the output section 3 to the active shield magnetic field generating section 5.

The excessive magnetic field detecting section 4 detects the external magnetic field of the circumference area of the memory body 2. Then, the angle and magnitude of the external magnetic field are calculated by computing (S88). The excessive magnetic field detecting section 4 monitors whether or not the magnitude of the detected external magnetic field is greater than the predetermined magnitude (S89). If the magnitude of the detected external magnetic field is equal to or greater than the predetermined magnitude (S89: Yes), the excessive magnetic field detecting section 4 judges whether or not the angle between the direction of the external magnetic field and the magnetization easy axis direction is 45 degree or less (S90). In the case of 45 degree or less (S90; Yes), the excessive magnetic field detecting section 4 outputs the first magnetic field direction signal (indicating the case of 45 degree or less) through the output section 3 to the active shield magnetic field generating section 5 (S91). On the other hand, the excessive magnetic field detecting section 4 outputs the magnetic field detecting signal to the memory body 2 and the output section 3. As a result, the memory body 2 stops its operation. In addition, the output section 3 outputs the magnetic field detecting signal to the active shield magnetic field generating section 5. The active shield magnetic field generating section 5 generates the active shield magnetic field Hs (the orientation shown in FIG. 18), in accordance with the magnetic field detecting signal and the first magnetic field direction signal. In the case of exceeding 45 degree (S90; No), the excessive magnetic field detecting section 4 outputs the second magnetic field direction signal (indicating the case of exceeding 45 degree) through the output section 3 to the active shield magnetic field generating section 5 (S92). On the other hand, the excessive magnetic field detecting section 4 outputs the magnetic field detecting signal to the memory body 2 and the output section 3. As a result of it, the memory body 2 stops its operation. In addition, the output section 3 outputs the magnetic field detecting signal to the active shield magnetic field generating section 5. The active shield magnetic field generating section 5 generates the active shield magnetic field Hs (the orientation shown in FIG. 21), in accordance with the magnetic field detecting signal and the second magnetic field direction signal. If the magnitude of the external magnetic field is smaller than the predetermined magnitude (S90: No), the excessive magnetic field detecting section 4 stops to output the magnetic field detecting signal to the memory body 2 and the output section 3 and cancels the magnetic field detecting signal (S93). Together with it, the excessive magnetic field detecting section 4 stops to output the first or second magnetic field direction signal and cancels the first or second magnetic field direction signal. Since the magnetic field detecting signal and the first or second magnetic field direction signal are canceled, the active shield magnetic field generating section 5 stops the magnetic field (active shield magnetic field Hs) (S94). Thus, the memory body 2 restarts its operation (S95). The output section 3 stops outputting the magnetic field detecting signal to the CPU. As a result of it, the access of the CPU to the MRAM 1b restarts.

As mentioned above, with the active shield magnetic field generating section 5 having the simple configuration, it is possible to prevent the erroneous writing inside the memory body 2, and it is also possible to protect the data in the memory body 2 from being destructed.

Third Embodiment

The configuration of the third embodiment of the MRAM of the present invention will be described below. FIG. 7A is a block diagram showing the configuration of the third embodiment of the MRAM of the present invention. The configuration of the MRAM 1 in this embodiment is similar to the first embodiment. However, a part of the configuration of the memory body 2 differs from the first embodiment. The configuration of the MRAM 1 may also be the configuration in FIG. 7B.

Figure 23:
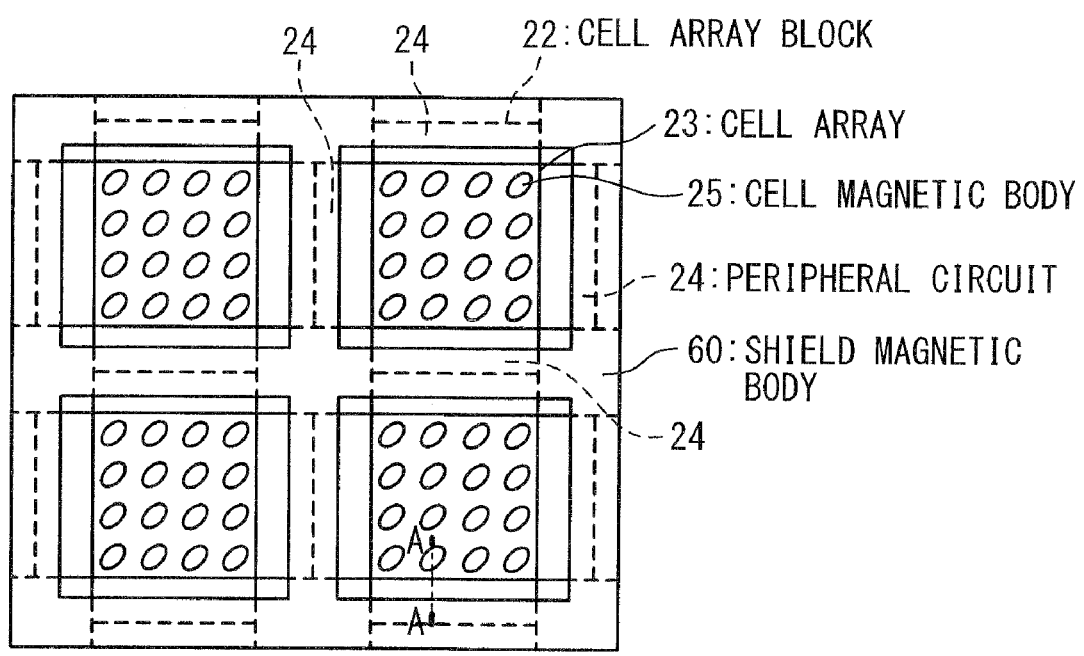
FIG. 23 is a schematic view showing a partial configuration of the memory body in the third embodiment of the MRAM of the present invention.

The basic configuration of the memory body 2 is similar to the first embodiment. However, it differs from the first embodiment in that this has a shield magnetic body 60 around the cell array 23. FIG. 23 is a schematic view showing a partial configuration of the memory body 2 in the third embodiment of the MRAM of the present invention. The shield magnetic body 60 for shielding the external magnetic field is installed to cover the region (the region that substantially includes the peripheral circuit 24) except the cell array 23 and peripheral circuit 21 in the memory body 2 shown in FIG. 11. FIG. 23 shows a part thereof.

Figure 24:
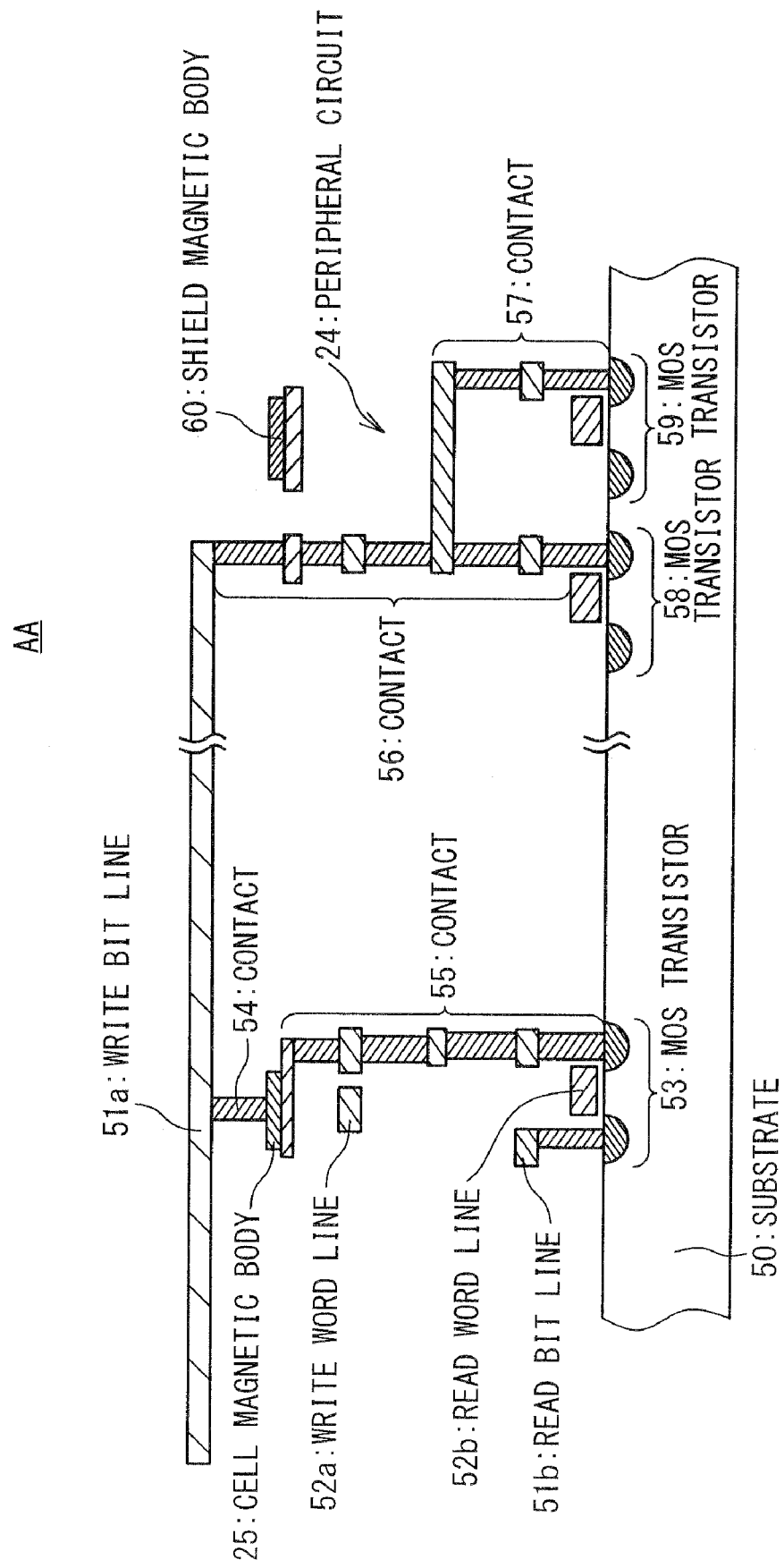
FIG. 24 is a schematic view showing a section of AA drawn in FIG. 23.

FIG. 24 is a schematic view showing the AA section in FIG. 23. The magnetic memory cell 20 includes a MOS transistor 53 and the cell magnetic body 25 which is a magnetoresistive element. The MOS transistor 53 is formed on a substrate 50. The MOS transistor 53 includes: a diffusion layer 53a connected through a contact 55 to a read bit line 51*b*; a channel region 53*b* connected to a read word line 52*b* as a gate; and a diffusion layer 53*c* connected through the contact 55 to one end of the cell magnetic body 25. The other end of the cell magnetic body 25 is connected through a contact 54 to a write bit line Sla. A write word line 52*a* is installed away below the cell magnetic body 25. The write bit line 51*a* is connected through contacts 56, 57 to the peripheral circuit 24 (exemplification: the Y-selector 26). As a part of the peripheral circuit 24, MOS transistors 58, 59 are illustrated. The shield magnetic body 60 is formed above the peripheral circuit 24. It is formed on the same layer as the cell magnetic body 25 for the substrate 50 in the drawing. Also, the lamination structure of the shield magnetic body 60 is same to the lamination structure of the cell magnetic body 25.

The cell magnetic body 25 of the magnetic memory cell 20 is not used over the peripheral circuit 24 (exemplification: the Y-selector 26). That is, usually, the cell magnetic body 25 does not exist over the peripheral circuit 24 (exemplification: the Y-selector 26). However, in the present invention, the cell magnetic body is daringly arranged as the shield magnetic body 60 and used as a magnetic shield against the external magnetic field. In this way, the same magnetic layer as the cell magnetic body 25 is arranged as the shield magnetic body 60 over the peripheral circuit 24 (exemplification: the Y-selector 26). Thus, when an external magnetic field is applied, a part of the magnetic flux of the external magnetic field is absorbed inside this shield magnetic body 60, and the influence on the cell array 23 is suppressed. This shield magnetic body 60 is formed at the same process with the formation of the cell magnetic body 25. That is, only changing a mask pattern is required and the processing dedicated to the shield magnetic body 60 is not required. Hence, it can be introduced without any increase in a tact time while the increase in a cost is suppressed.

The shield magnetic body 60 is not limited to this example. It may be installed in a layer higher than the cell magnetic body 25 with respect to the substrate 50. In the case, it is possible to surely suppress the influence of the external magnetic field on the cell magnetic body 25.

Since the other configurations of the MRAM in this embodiment are similar to the first embodiment, their explanations are omitted.

In the present invention, since the shield magnetic body 60 is arranged around the cell array 23, it is possible to suppress the influence of the external magnetic field on the cell magnetic body 25. Thus, it is possible to prevent the erroneous writing inside the memory body 2, and it is also possible to protect the data in the memory body 2 from being destructed.

Fourth Embodiment

The configuration of the fourth embodiment of the MRAM of the present invention will be described below. This embodiment differs from the third embodiment in the use of a shield magnetic body 61 having a predetermined shape formed by patterning.

Figure 25A:
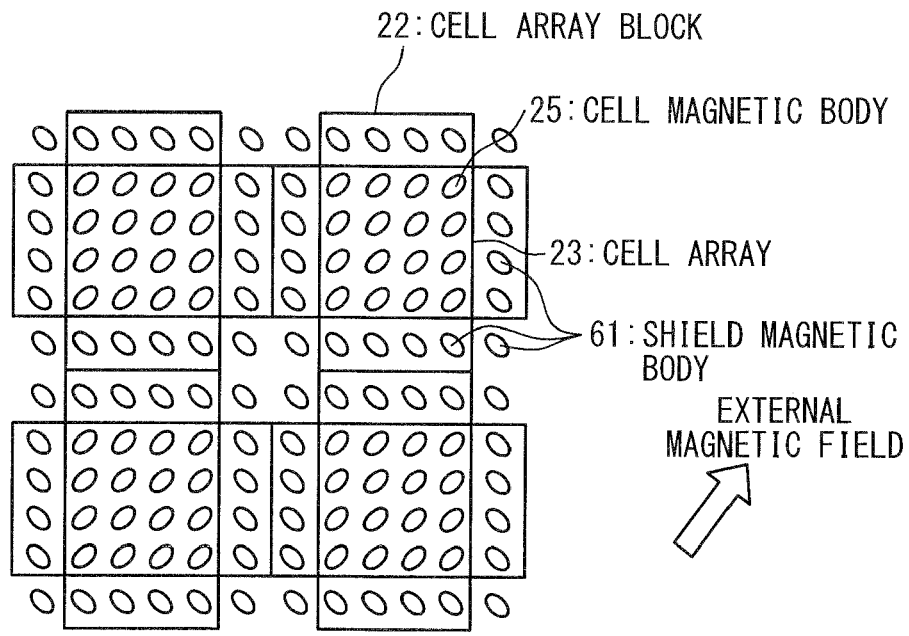
FIG. 25A is a schematic view showing a partial configuration of the memory body in the fourth embodiment of the MRAM of the present invention.
Figure 25B:
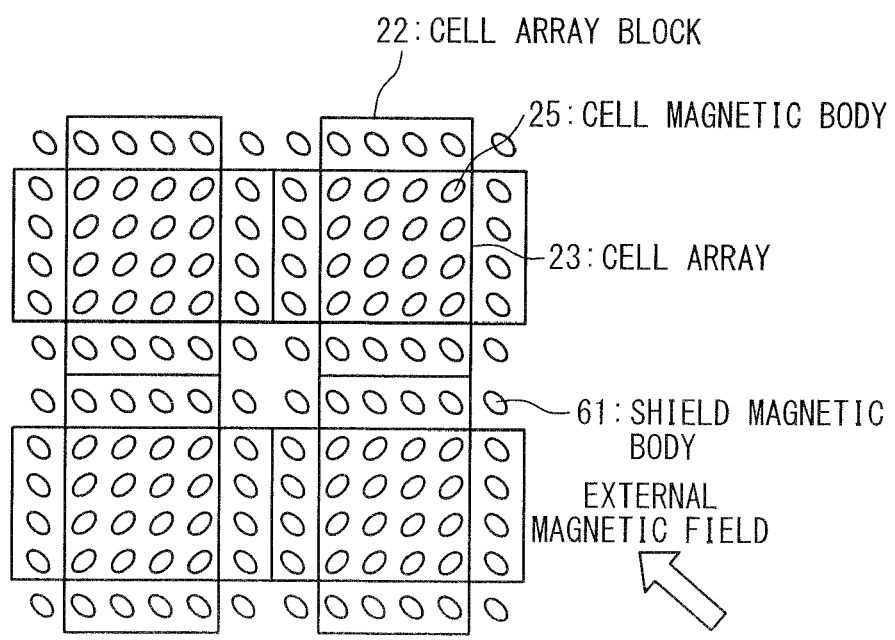
FIG. 25B is a schematic view showing a partial configuration of the memory body in the fourth embodiment of the MRAM of the present invention.

FIG. 25A to FIG. 25B are a schematic views showing a partial configuration of the memory body 2 in the fourth embodiment of the MRAM of the present invention. The basic shape of the shield magnetic body 61 is an approximate ellipse that is similar to the cell magnetic body 25. The lamination structure of the shield magnetic body 61 is also same to the lamination structure of the cell magnetic body 25. However, the magnetization easy axis and the magnetization hard axis differ from the cell magnetic body 25 by 90 degree. That is, the direction of the magnetization easy axis of the cell magnetic body 25 is parallel to the direction of the magnetization hard axis of the shield magnetic body 61. The direction of the magnetization hard axis of the cell magnetic body 25 is parallel to the direction of the magnetization easy axis of the shield magnetic body 61. The shield magnetic body 61 is placed to cover the region (the region that substantially includes the peripheral circuit 24) in which the shield magnetic body 61 shown in FIG. 23 is placed. FIG. 25A to FIG. 25B show a part thereof.

A section of the MRAM in this embodiment is as shown in FIG. 24 except that the shield magnetic body 61 is a plurality of ellipse shapes which are dividedly arranged. Thus, its explanation is omitted. Also, since the other configurations of the MRAM in this embodiment are similar to the third embodiment, their explanations are omitted.

This embodiment is designed such that the shield magnetic body 61 has the foregoing shape. Thus, the magnetization easy axis and magnetization hard axis of the shield magnetic body 61 are clearly defied. Hence, as shown in FIG. 10B, below the flop magnetic field Hf, the shield magnetic body 61 is hard to be magnetized in the magnetization easy axis direction. In the examples of FIG. 25A to FIG. 25B, the magnetization easy axis direction of the shield magnetic body 61 is made orthogonal to the magnetization easy axis direction of the cell magnetic body 25 (MTJ) in the magnetic memory cell 20 that is the toggle cell. Thus, the component in the magnetization easy axis direction of the cell magnetic body in the external magnetic field is shielded stronger than the component of the magnetization hard axis of the cell magnetic body in the external magnetic field. That is, the case of FIG. 25A can strongly shield the external magnetic field as compared with the case of FIG. 25B. When the magnetic memory cell 20 is the toggle cell, there is the effect that the applied external magnetic field is effectively put away from the flop magnetic field Hf. Thus, with the principle similar to shown in FIG. 18, it is possible to achieve the shield effect equal to or greater than the case when the magnitude of the external magnetic field is shielded.

In the present invention, it is possible to achieve the effects similar to the third embodiment. In addition, as shown in FIG. 25A to FIG. 25B, there is a merit of the manufacture that in the processing, by executing the patterning of the shield magnetic body 61 and the cell magnetic body 25 whose shape are substantially same to each other and only the directions thereof are different to each other, the etching condition and the like thereof can be set to equal.

Figure 26:
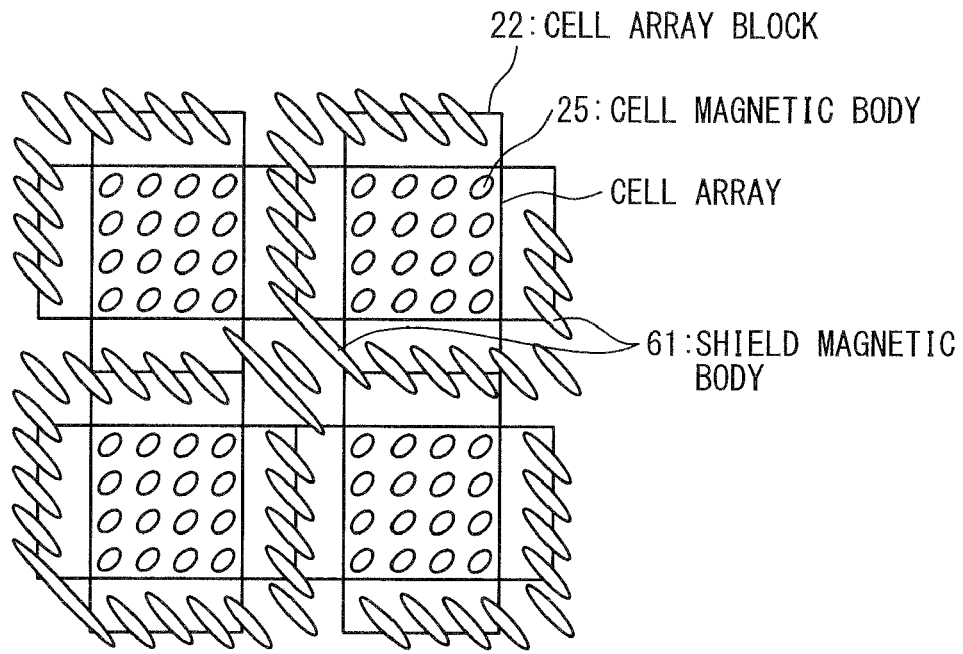
FIG. 26 is a schematic view showing another configuration of a part of the memory body in the fourth embodiment of the MRAM of the present invention.

FIG. 26 is a schematic view showing another configuration of a part of the memory body in the fourth embodiment of the MRAM of the present invention. The area of the shield magnetic body 61 in this FIG. 26 is larger than the area in the cases of FIG. 25A to FIG. 25B. That is, by adopting such a design, the quantity of the magnetic body can be increased as compared to the cases of FIG. 25A to FIG. 25B and consequently the external magnetic field which is absorbed can be larger.

Fifth Embodiment

The configuration of the fifth embodiment of the MRAM of the present invention will be described below. This embodiment differs from the fourth embodiment in that not only the shield magnetic body 61 is placed above the peripheral circuit 24, but also a shield magnetic body 62 is also placed above the cell array 23.

Figure 27:
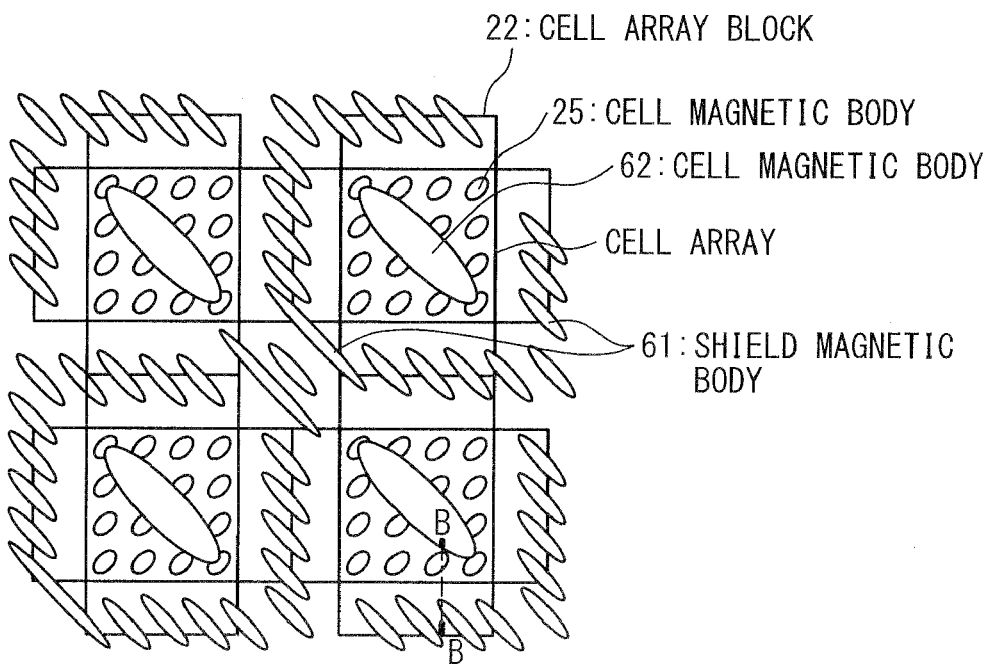
FIG. 27 is a schematic view showing a partial configuration of the memory body in the fifth embodiment of the MRAM of the present invention.

FIG. 27 is a schematic view showing a partial configuration of the memory body 2 in the fifth embodiment of the MRAM of the present invention. As compared with the case of FIG. 26 (FIG. 25A to FIG. 25B are also allowable), the shield magnetic body 62 is additionally placed above the cell array 23. Its size is preferred to be larger than, for example, the cell magnetic body 25. This is because the suppression effect against the external magnetic field becomes greater. Its shape is preferably configured to be the approximate ellipse similar (resembling) to the cell magnetic body 25. The shield magnetic body 62 has only the free layer. Thus, the lamination structure is not required and its manufacturing is easy.

The magnetization easy axis and the magnetization hard axis are same to the shield magnetic body 61. FIG. 27 shows a part thereof. However, this may have the same lamination structure as the lamination structure of the cell magnetic body 25.

Figure 28:
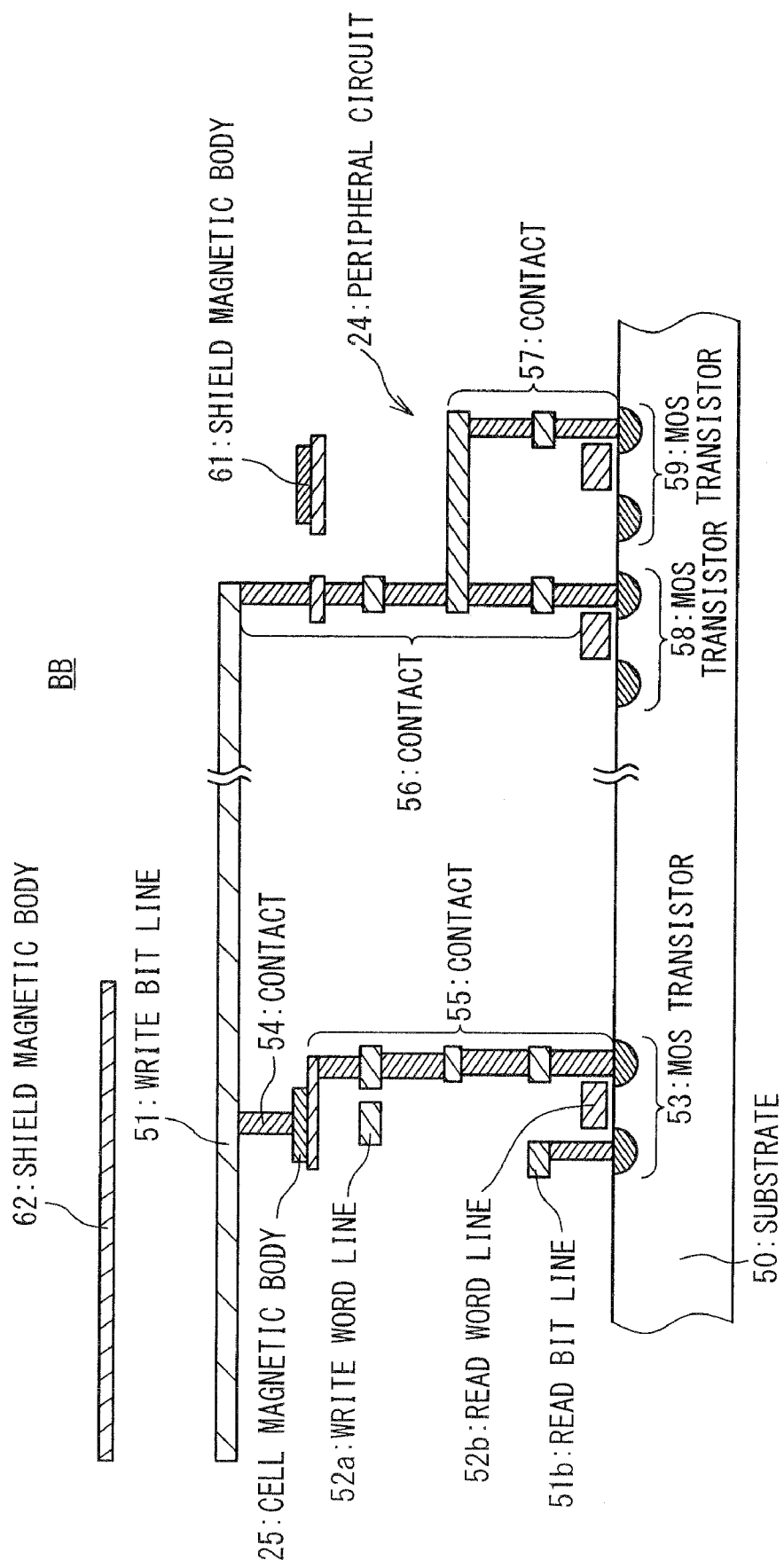
FIG. 28 is a schematic view showing a section of BB drawn in FIG. 27.

FIG. 28 is a schematic view showing the BB section in FIG. 27. This embodiment differs from the third embodiment (FIG. 24) and the fourth embodiment in that the magnetic layer dedicated to the shield is newly formed and the shield magnetic body 62 is formed above the cell array 23. Moreover, this shield magnetic body 62 is defined as the laminated ferri structure. In this case, the shield magnetic body 62 can be designed independently of the cell magnetic body 25. Thus, it is possible to select the film thickness, structure and the like, which can exhibit the principle shown in FIG. 18 more effectively.

Since the other configurations of the MRAM in this embodiment are similar to the fourth embodiment, their explanations are omitted.

In the present invention, the effects similar to the fourth embodiment can be obtained. In addition, by forming the larger shield magnetic body 62, the suppression effect of the external magnetic field can be further increased.

As mentioned above, according to the present invention, it is possible to reduce erroneous operation, which is caused by the erroneous write and the destruction of the stored data, and increase the allowable magnitude against the external magnetic field and further improve the convenience of the MRAM. The above-mentioned respective embodiments (including the variations) can be embodied by the combinations thereof, under the condition that the combined embodiments do not conflict with each other. Moreover, the present invention is not limited to the above-mentioned respective embodiments. It is clear that the respective embodiments can be properly varied within the range of the technical idea of the present invention.

The invention claimed is:

1. A magnetic random access memory comprising:
a memory body including at least one cell array; and
a magnetic field detecting section configured to detect an external magnetic field in a circumference area of the memory body to output a detecting signal to the memory body,
wherein the cell array comprises a plurality of magnetic memory cells, and
each of the plurality of magnetic memory cells includes a magnetoresistive element comprising a laminated ferri structure as a free layer.

2. The magnetic random access memory according to claim 1, wherein the memory body is configured to stop a predetermined operation of the memory body in response to the detecting signal.

3. The magnetic random access memory according to claim 2, further comprising:
an output section configured to receive the detecting signal outputted from the magnetic field detecting section and output the detecting signal to an outside.

4. The magnetic random access memory according to claim 2, further comprising:
a reference cell writing section configured to execute writing on a reference cell of the plurality of magnetic memory cells,
wherein the memory body restarts the writing in response to a cancellation of the detecting signal after a writing operation on the memory body as the predetermined operation, and
the reference cell writing section is configured to execute the writing on the reference cell before a start of the writing operation.

5. The magnetic random access memory according to claim 2, wherein the magnetic field detecting section is configured to output a direction signal indicating a direction of the external magnetic field, and
the magnetic random access memory further comprises a magnetic field generating section configured to generate a shield magnetic field whose direction is corresponding to the direction of the external magnetic field at the memory body based on the detecting signal and the direction signal.

6. The magnetic random access memory according to claim 5, wherein the plurality of magnetic memory cells are toggle cells, and
the magnetic field generating section includes a coiled interconnection winded to direct a magnetization hard axis of each of the plurality of magnetic memory cells to surround the memory body.

7. The magnetic random access memory according to claim 5, wherein the magnetic field detecting section includes:
a plurality of magnetoresistive elements whose directions of magnetization easy axes are different to each other; and
a calculating section configured to calculate a direction and a magnitude of the external magnetic field based on a resistance of each of the plurality of magnetoresistive elements.

8. The magnetic random access memory according to claim 7, wherein each of the plurality of magnetic memory cells comprises a magnetoresistive element including a first laminated fern structure as a free structure,
the shield magnetic body includes a plurality of first magnetic memory cells,
each of the plurality of first magnetic memory cells comprises a magnetoresistive element including a second laminated ferri structure as a free layer, and
a magnetization easy axis of the first laminated fern structure and a magnetization easy axis of the second laminated ferri structure are substantially orthogonal to each other.

9. The magnetic random access memory according to claim 8, wherein the shield magnetic body includes a plurality of second magnetic memory cells of the plurality of magnetic memory cells,
each of the plurality of second magnetic memory cells comprises a magnetoresistive element including a third laminated fern structure as a free layer, and
a magnetization easy axis of the first laminated fern structure and a magnetization easy axis of the third laminated fern structure are substantially orthogonal to each other.

10. A magnetic random access memory comprising:
a plurality of cell arrays;
a plurality of peripheral circuits formed between each of the plurality of cell arrays; and a shield magnetic body formed over the plurality of peripheral circuits and designed to shield an external magnetic field in a circumference area of the plurality of cell arrays, wherein each of the plurality of cell arrays includes a plurality of magnetic memory cells.

11. The magnetic random access memory according to claim 10, wherein a laminated structure of the shield magnetic body is same to a laminated structure of each of the plurality of magnetoresistive elements.

12. An operating method of a magnetic random access memory comprising:
  (a) detecting an external magnetic field whose magnitude is larger than a reference value in a circumference area of a memory body including at least one cell array to output a detecting signal to the memory body; and
  (b) stopping a writing operation of the memory body in response to the detecting signal,
  wherein the cell array comprises a plurality of magnetic memory cells, and
  each of the plurality of magnetic memory cells includes a magnetoresistive element comprising a laminated fern structure as a free layer.

13. The operating method of the magnetic random access memory according to claim 12, wherein the (b) stopping includes:
  (b1) outputting the detecting signal to outside.

14. The operating method of the magnetic random access memory according to claim 12, further comprising:
  (c) canceling the detecting signal when a magnitude of the external magnetic field is detected to be smaller than a reference value in a circumference area of the memory body; and
  (d) restarting the writing operation on the memory body in response to the canceling of the detecting signal.

15. The operating method of the magnetic random access memory according to claim 14, wherein the (d) restarting includes:
  (d1) executing writing on a reference cell of the plurality of the magnetic memory cells before the restarting.

16. The operating method of the magnetic random access memory according to claim 12, wherein the (a) detecting includes:
  (a1) outputting a direction signal indicating a direction of the external magnetic field, and
  the operating method further comprises:
  (e) generating a shield magnetic field having a direction corresponding to the direction on the memory body based on the detecting signal and the direction signal.

17. The operating method of the magnetic random access memory according to claim 16, wherein the plurality of memory cells are toggle cells, and
  the (e) generating includes:
  (e1) generating the shield magnetic field so that a synthesized magnetic field of the external magnetic field and the shield magnetic field is kept away from a flop magnetic field of each of the plurality of memory cells in a magnetization hard axis of each of the plurality of magnetic memory cells.

18. The operating method of the magnetic random access memory according to claim 16, wherein the (a1) outputting includes:
  (a11) calculating a direction and a magnitude of the external magnetic field based on a resistance of each of the plurality of magnetoresistive elements formed in a circumference area of the memory body and whose magnetization easy axis direction is different to each other.

* * * * *